United States Patent
Kawashima et al.

(10) Patent No.: US 11,435,637 B2
(45) Date of Patent: Sep. 6, 2022

(54) DISPLAY APPARATUS AND ELECTRONIC DEVICE

(71) Applicant: Semiconductor Energy Laboratory Co., Ltd., Atsugi (JP)

(72) Inventors: Susumu Kawashima, Atsugi (JP); Naoto Kusumoto, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 17/262,426

(22) PCT Filed: Sep. 9, 2019

(86) PCT No.: PCT/IB2019/057559
§ 371 (c)(1),
(2) Date: Jan. 22, 2021

(87) PCT Pub. No.: WO2020/058798
PCT Pub. Date: Mar. 26, 2020

(65) Prior Publication Data
US 2021/0294139 A1    Sep. 23, 2021

(30) Foreign Application Priority Data
Sep. 21, 2018  (JP) .............................. JP2018-176865

(51) Int. Cl.
*G02F 1/1368*    (2006.01)
*G02F 1/1362*    (2006.01)
*G09G 3/36*    (2006.01)

(52) U.S. Cl.
CPC ...... *G02F 1/1368* (2013.01); *G02F 1/136286* (2013.01); *G09G 3/3688* (2013.01); *G09G 2300/0426* (2013.01)

(58) Field of Classification Search
CPC .................................................... G02F 1/1368
See application file for complete search history.

(56) References Cited

U.S. PATENT DOCUMENTS 8,373,633 B2    2/2013    Lai et al.
8,976,090 B2    3/2015    Yamamoto et al.
(Continued)

FOREIGN PATENT DOCUMENTS

| CN | 101510414 A | 8/2009 |
|---|---|---|
| CN | 102654979 A | 9/2012 |

(Continued)

OTHER PUBLICATIONS

International Search Report (Application No. PCT/IB2019/057559) dated Dec. 17, 2019.

(Continued)

*Primary Examiner* — Sang V Nguyen
(74) *Attorney, Agent, or Firm* — Robinson Intellectual Property Law Office; Eric J. Robinson

(57) ABSTRACT

A display apparatus capable of supplying a high voltage to a display device is provided. A pixel has a function of retaining first data, a function of adding second data to the first data to generate third data, and a function of supplying the third data to the display device. Capacitive coupling by a capacitor is used for data addition. Two pixels provided in the vertical direction (the direction in which a source line extends) share components including the capacitor; thus, the area where the two pixels are provided can be assigned to the capacitor, which can increase the capacitance value. Thus, the data addition by the capacitive coupling can be efficiently performed.

15 Claims, 21 Drawing Sheets

(56) References Cited

U.S. PATENT DOCUMENTS

| | | |
|---|---|---|
| 9,129,555 B2 | 9/2015 | Lee et al. |
| 9,378,676 B2 | 6/2016 | Nomura |
| 9,500,916 B2 | 11/2016 | Fukai et al. |
| 9,666,129 B2 | 5/2017 | Nomura |
| 9,799,267 B2 | 10/2017 | Nomura |
| 10,140,940 B2 | 11/2018 | Aoki |
| 10,338,419 B2 | 7/2019 | Fukai et al. |
| 10,345,661 B2 | 7/2019 | Miyake et al. |
| 10,437,123 B2 | 10/2019 | Kubota et al. |
| 10,446,079 B2 | 10/2019 | Ka et al. |
| 11,107,400 B2 | 8/2021 | Ka et al. |
| 2010/0007594 A1 | 1/2010 | Lai et al. |
| 2010/0157185 A1* | 6/2010 | Kim ............... G09G 3/3659 349/38 |
| 2012/0223978 A1 | 9/2012 | Yamamoto et al. |
| 2014/0176402 A1 | 6/2014 | Lee et al. |
| 2017/0025080 A1 | 1/2017 | Aoki |
| 2020/0142229 A1* | 5/2020 | Kusunoki ............ G02F 1/1368 |
| 2020/0175905 A1 | 6/2020 | Yamazaki et al. |
| 2020/0194527 A1 | 6/2020 | Kawashima et al. |
| 2021/0390907 A1 | 12/2021 | Ka et al. |

FOREIGN PATENT DOCUMENTS

| | | |
|---|---|---|
| CN | 103886834 A | 6/2014 |
| CN | 104282261 A | 1/2015 |
| CN | 104345505 A | 2/2015 |
| CN | 105005166 A | 10/2015 |
| CN | 107735725 A | 2/2018 |
| DE | 102013114454 | 6/2014 |
| EP | 3264409 A | 1/2018 |
| GB | 2510976 | 8/2014 |
| JP | 2007-096055 A | 4/2007 |
| JP | 2007-123861 A | 5/2007 |
| JP | 2010-020302 A | 1/2010 |
| JP | 2011-119674 A | 6/2011 |
| JP | 2012-145655 A | 8/2012 |
| JP | 2012-185328 A | 9/2012 |
| JP | 2014-123128 A | 7/2014 |
| JP | 2017-027012 A | 2/2017 |
| KR | 2009-0104232 A | 10/2009 |
| KR | 2010-0070663 A | 6/2010 |
| KR | 2014-0080890 A | 7/2014 |
| TW | 201003622 | 1/2010 |
| TW | 201426715 | 7/2014 |
| WO | WO-2009/145430 | 12/2009 |

OTHER PUBLICATIONS

Written Opinion (Application No. PCT/IB2019/057559) dated Dec. 17, 2019.

Chinese Office Action (Application No. 201980060567.9) dated Mar. 29, 2022.

* cited by examiner

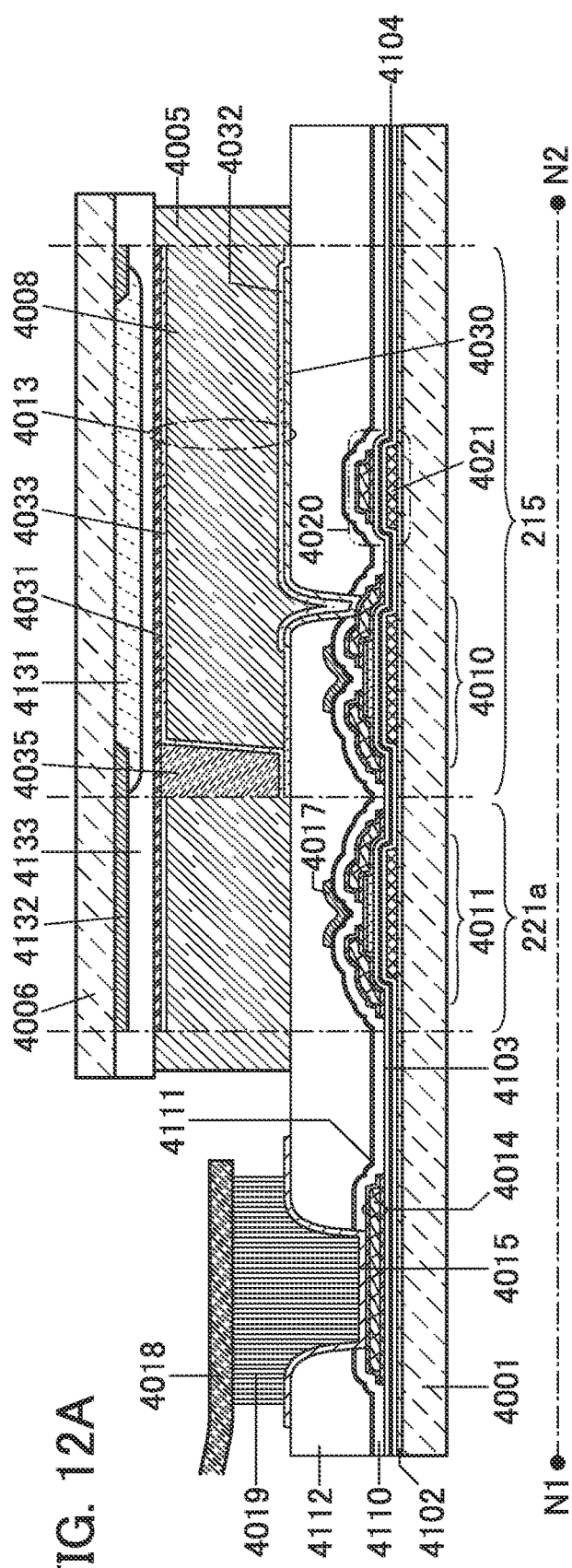
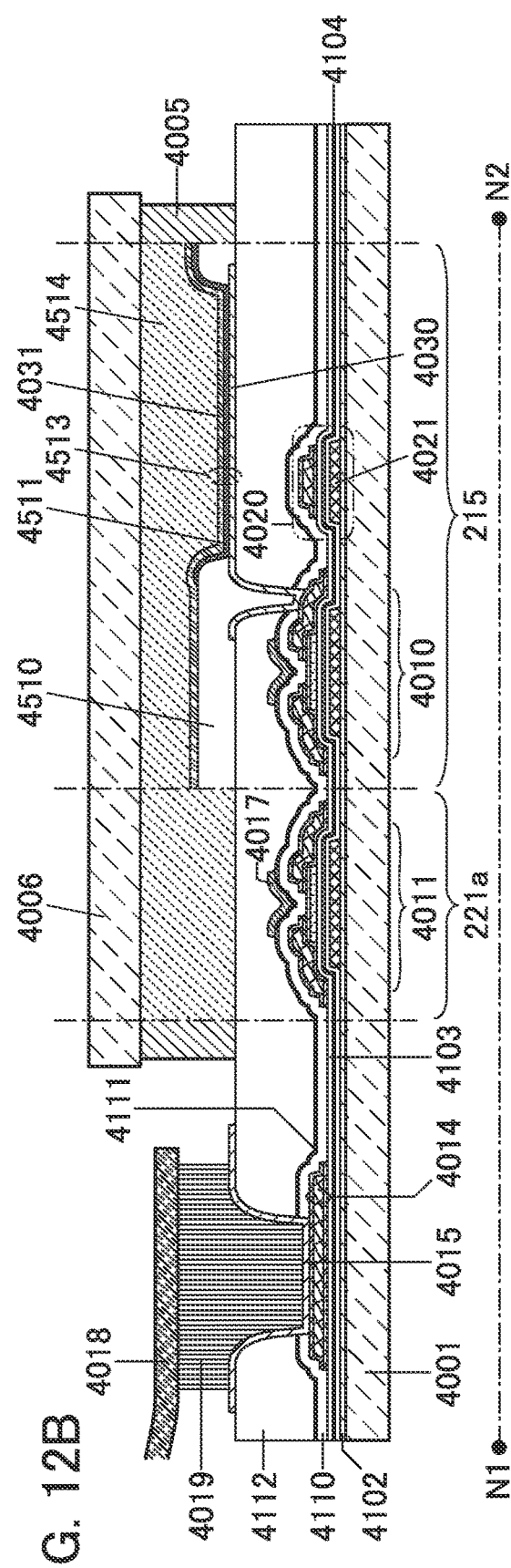
FIG. 12A
FIG. 12B

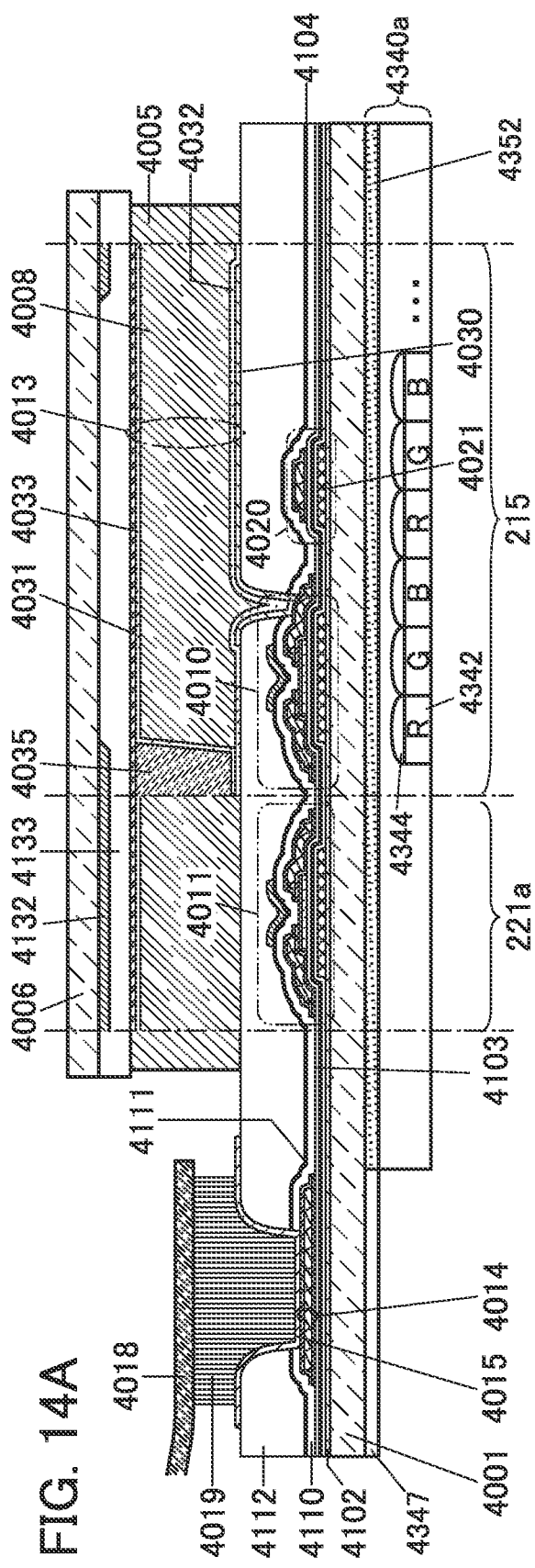
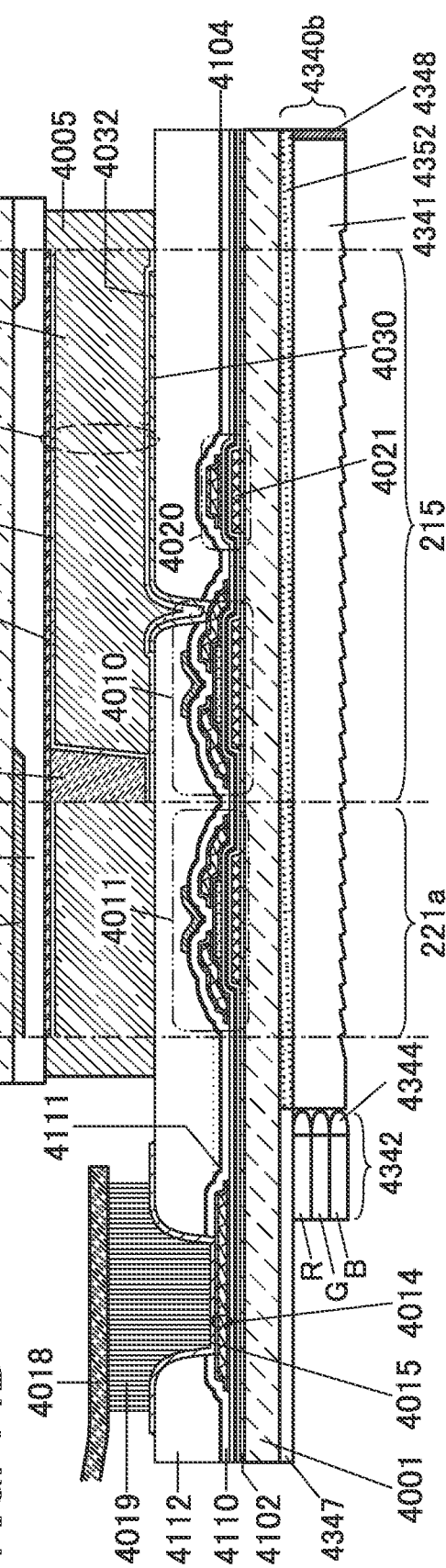
FIG. 14A
FIG. 14B

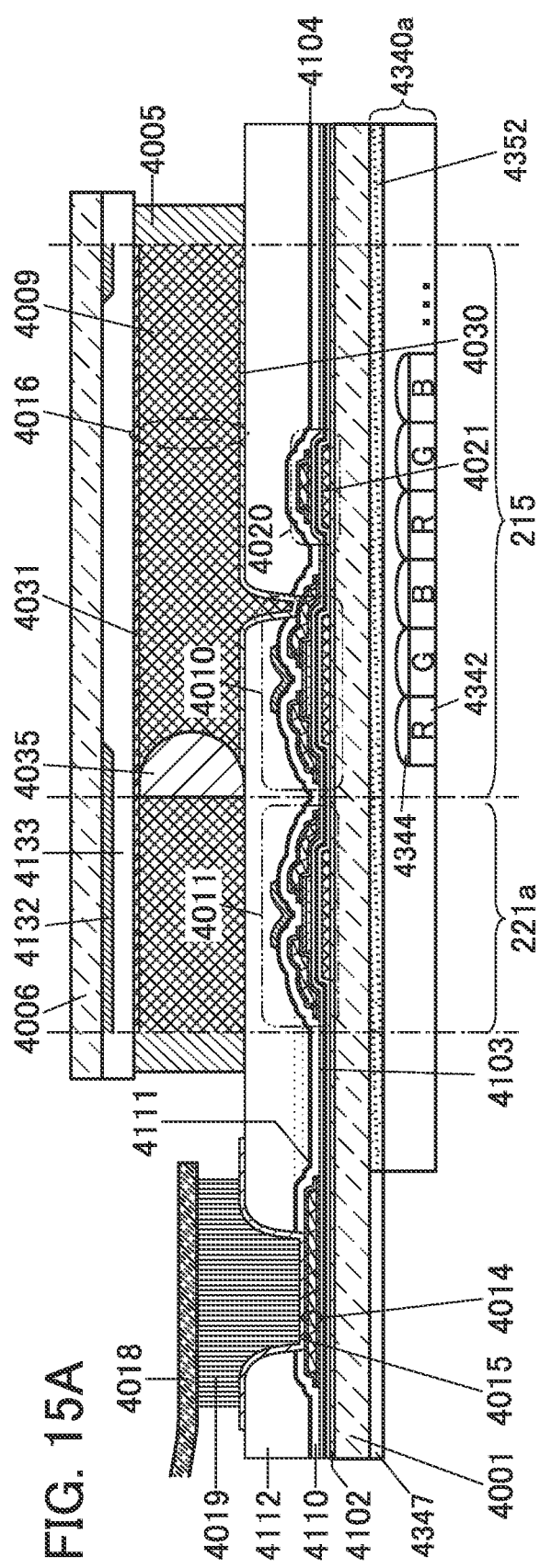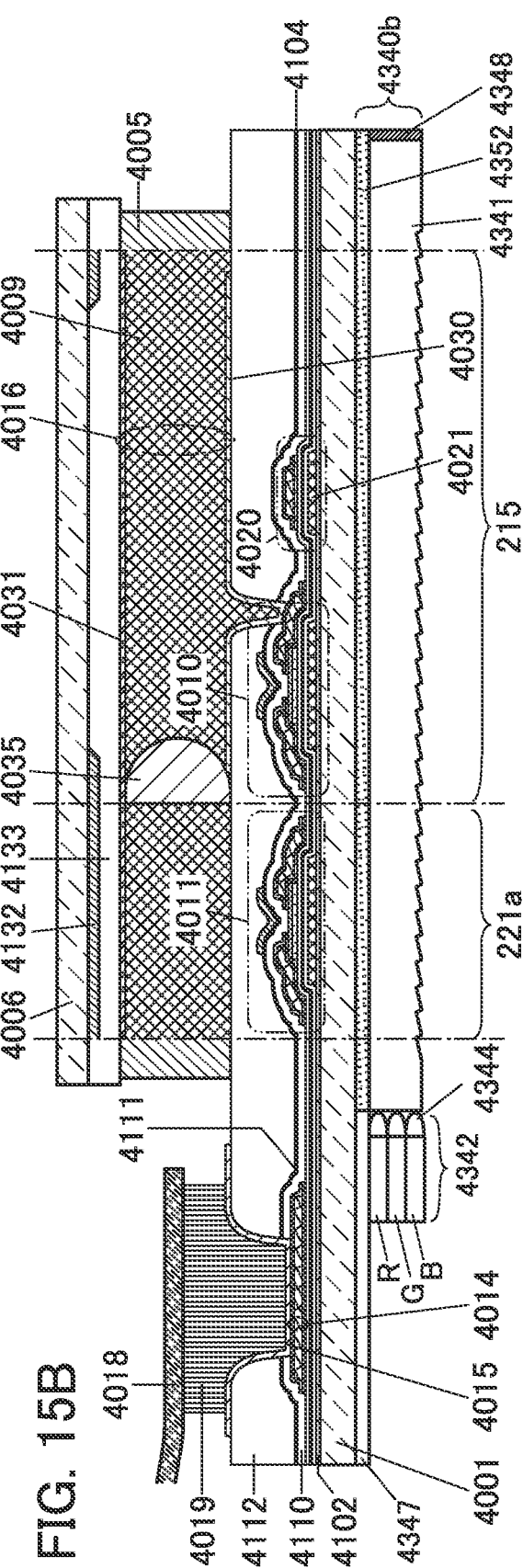

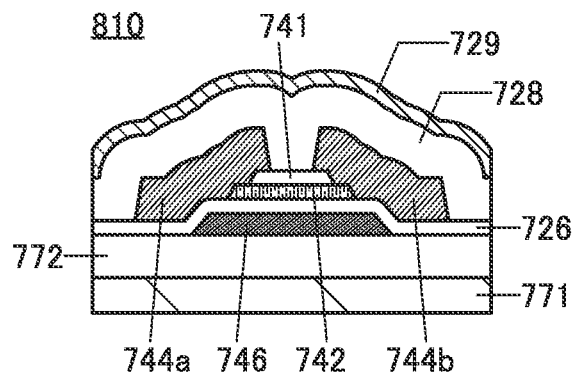
FIG. 17A1
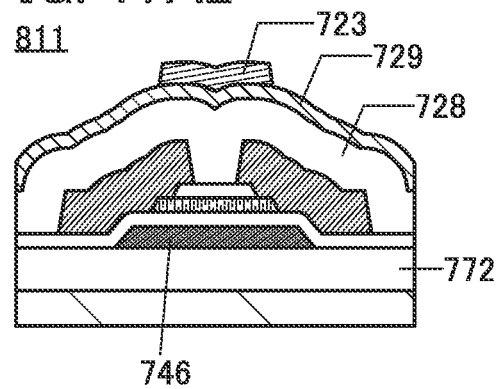
FIG. 17A2
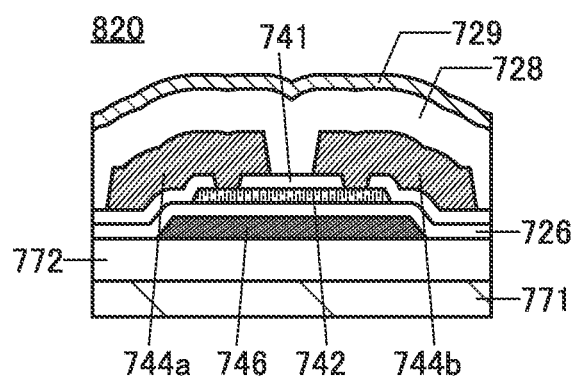
FIG. 17B1
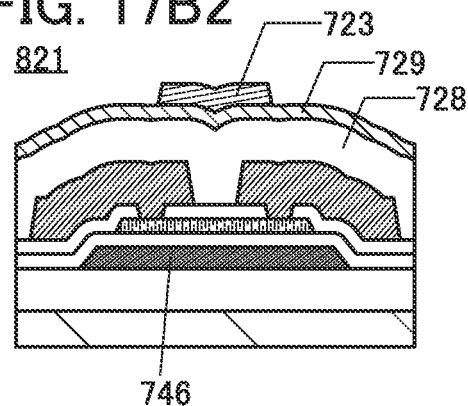
FIG. 17B2
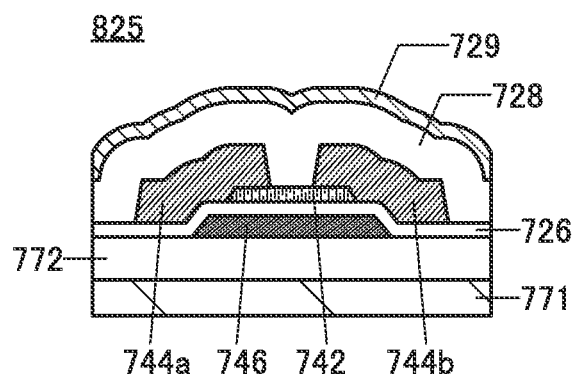
FIG. 17C1
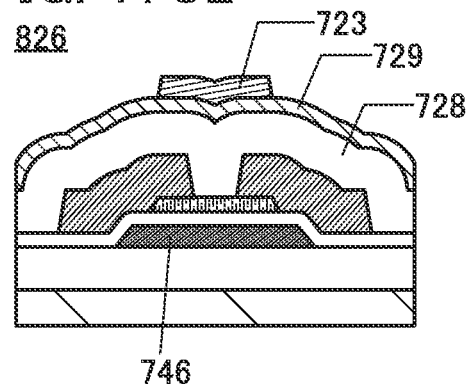
FIG. 17C2

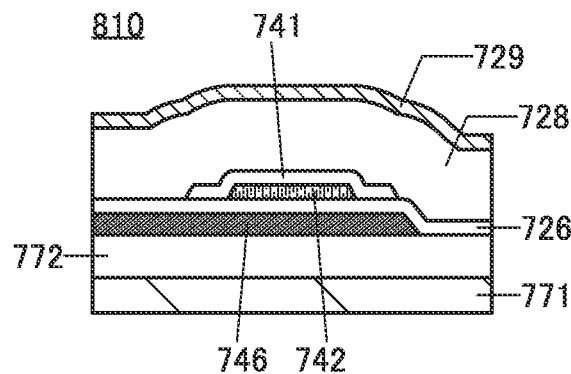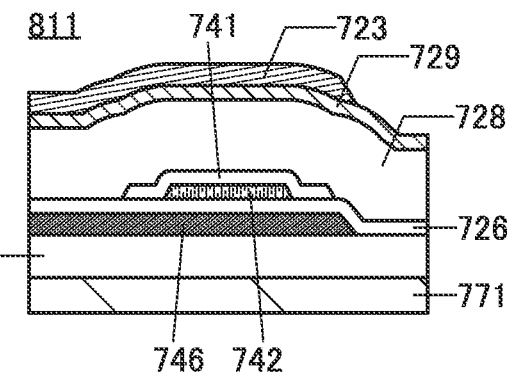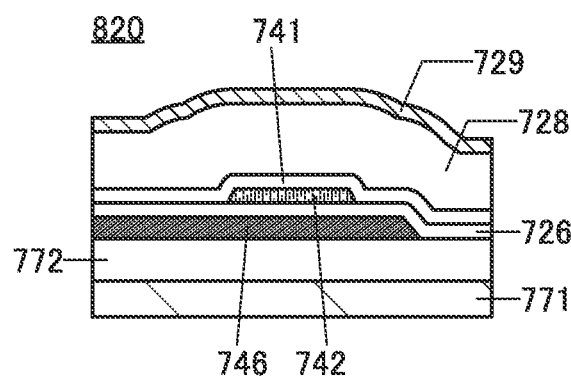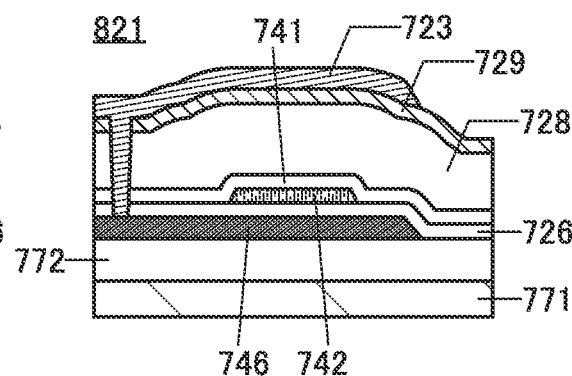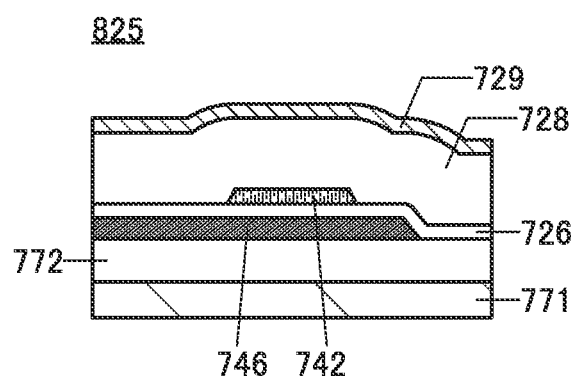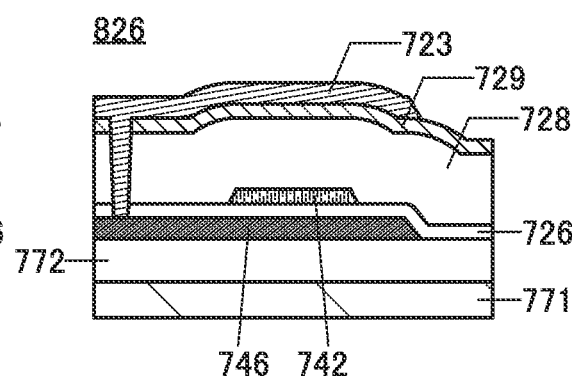

FIG. 19A1
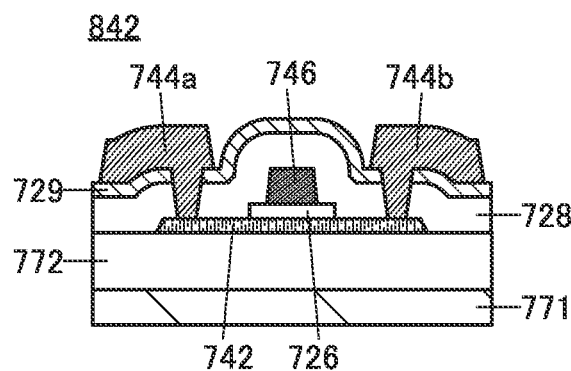
FIG. 19A2
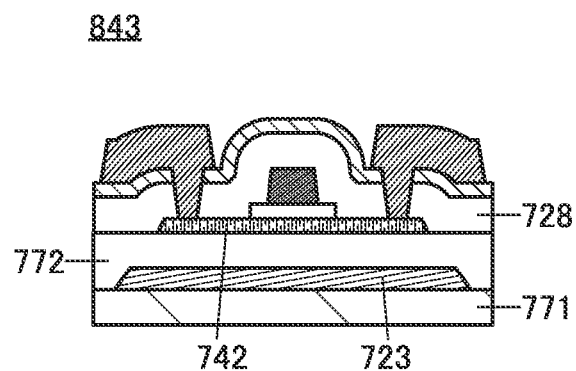
FIG. 19B1
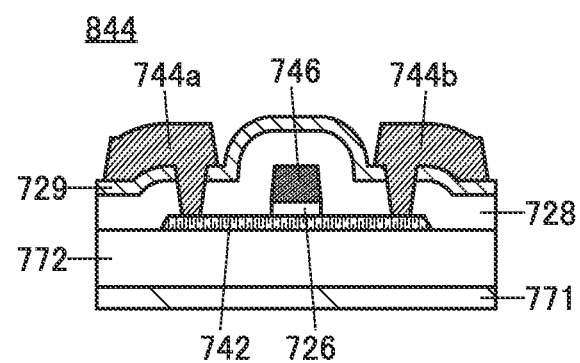
FIG. 19B2
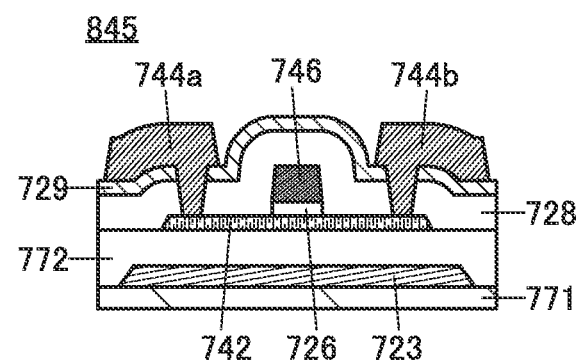
FIG. 19C1
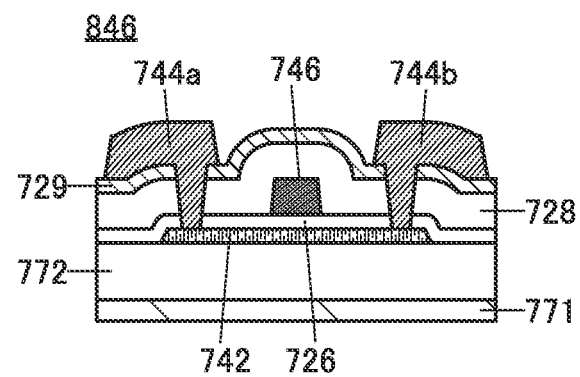
FIG. 19C2
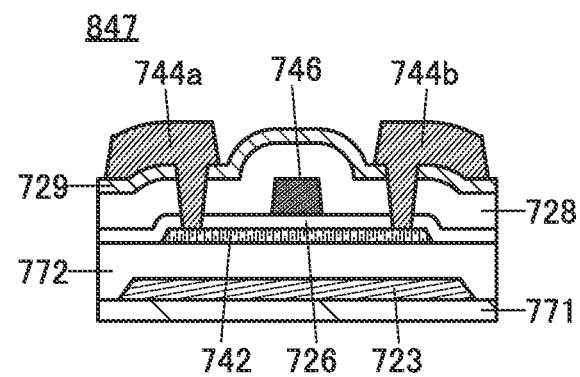

FIG. 20A1
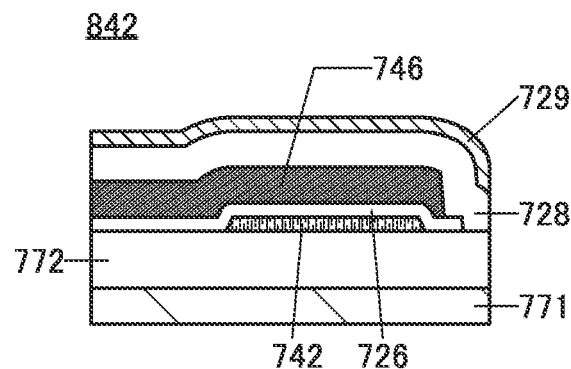
FIG. 20A2
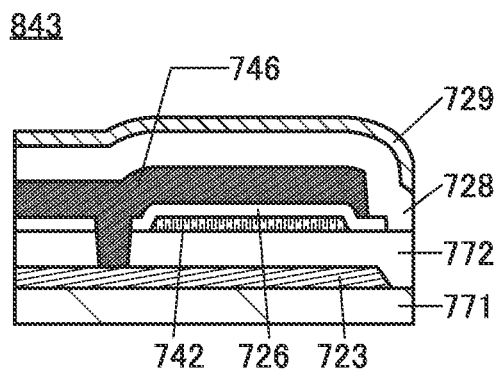
FIG. 20B1
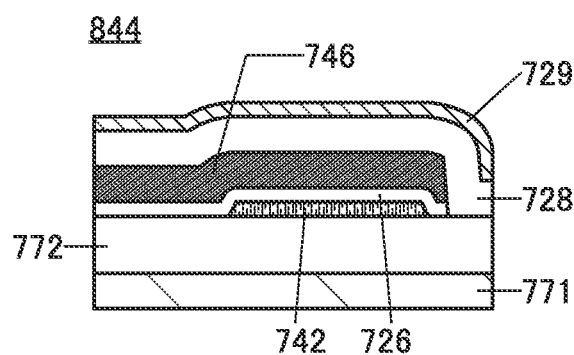
FIG. 20B2
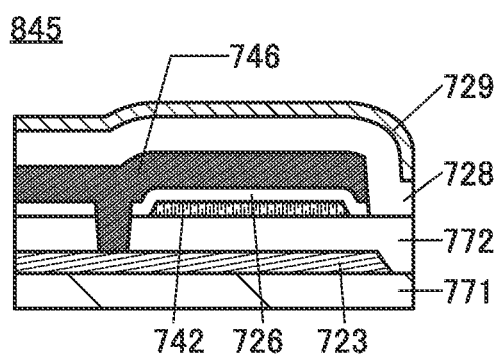
FIG. 20C1
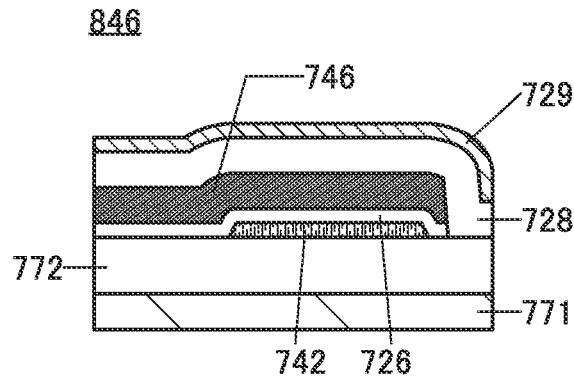
FIG. 20C2
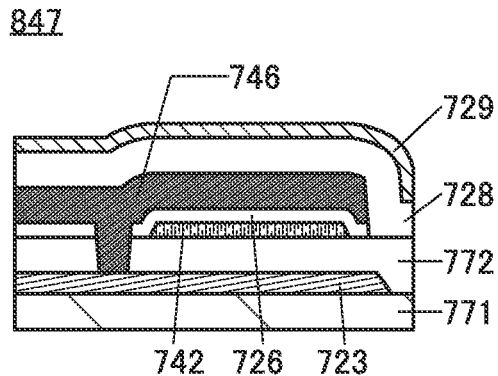

DISPLAY APPARATUS AND ELECTRONIC DEVICE

TECHNICAL FIELD

One embodiment of the present invention relates to a display apparatus.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Accordingly, more specific examples of the technical field of one embodiment of the present invention disclosed in this specification include a semiconductor device, a display apparatus, a liquid crystal display apparatus, a light-emitting apparatus, a lighting device, a power storage device, a memory device, an imaging device, an operation method thereof, and a manufacturing method thereof.

In this specification and the like, a semiconductor device generally means a device that can function by utilizing semiconductor characteristics. A transistor and a semiconductor circuit are embodiments of semiconductor devices. In some cases, a memory device, a display apparatus, an imaging device, or an electronic device includes a semiconductor device.

BACKGROUND ART

A technique for forming transistors using a metal oxide formed over a substrate has been attracting attention. For example, a technique in which a transistor formed using zinc oxide or an In—Ga—Zn-based oxide is used as a switching element or the like of a pixel of a display apparatus is disclosed in Patent Document 1 and Patent Document 2.

Patent Document 3 discloses a memory device having a structure in which a transistor with an extremely low off-state current is used in a memory cell.

REFERENCES

Patent Documents

[Patent Document 1] Japanese Published Patent Application No. 2007-123861
[Patent Document 2] Japanese Published Patent Application No. 2007-96055
[Patent Document 3] Japanese Published Patent Application No. 2011-119674

SUMMARY OF THE INVENTION

Problems to be Solved by the Invention

Driving a dispersive liquid crystal device, a tandem light-emitting device, and the like sometimes requires a voltage higher than the driving voltage of a general display device; thus, a source driver with a higher output than a general-purpose source driver needs to be used. A high output source driver consumes high power, and requires a new driver IC to be developed in some cases.

Thus, an object of one embodiment of the present invention is to provide a display apparatus capable of supplying a high voltage to a display device. Another object is to provide a display apparatus capable of supplying a voltage higher than or equal to the output voltage of a source driver to a display device. Another object is to provide a display apparatus capable of enhancing the luminance of a displayed image. Another object is to provide a display apparatus in which the aperture ratio of a pixel can be increased.

Another object is to provide a display apparatus with low power consumption. Another object is to provide a highly reliable display apparatus. Another object is to provide a novel display apparatus or the like. Another object is to provide a method for driving any of the above display apparatuses. Another object is to provide a novel semiconductor device or the like.

Note that the description of these objects does not preclude the existence of other objects. One embodiment of the present invention does not have to achieve all these objects. Other objects are apparent from the description of the specification, the drawings, the claims, and the like, and other objects can be derived from the description of the specification, the drawings, the claims, and the like.

Means for Solving the Problems

One embodiment of the present invention relates to a display apparatus capable of supplying a high voltage to a display device.

One embodiment of the present invention is a display apparatus including a first pixel circuit and a second pixel circuit; the first pixel circuit includes a first transistor, a second transistor, a third transistor, a capacitor, and a first display device; the second pixel circuit includes the first transistor, the second transistor, a fourth transistor, the capacitor, and a second display device; a circuit composed of the first transistor, the second transistor, and the capacitor has a function of adding first data and second data to generate third data; and the third data is supplied to the first display device or the second display device.

Another embodiment of the present invention is a display apparatus including a first pixel circuit and a second pixel circuit; the first pixel circuit includes a first transistor, a second transistor, a third transistor, a first capacitor, and a first circuit; the second pixel circuit includes the first transistor, the second transistor, a fourth transistor, the first capacitor, and a second circuit; the first circuit and the second circuit each include a display device; one of a source and a drain of the first transistor is electrically connected to one electrode of the first capacitor; the one electrode of the first capacitor is electrically connected to one of a source and a drain of the third transistor; the other of the source and the drain of the third transistor is electrically connected to the first circuit; the other electrode of the first capacitor is electrically connected to one of a source and a drain of the second transistor; the one of the source and the drain of the second transistor is electrically connected to the other of the source and the drain of the fourth transistor; and the other of the source and the drain of the fourth transistor is electrically connected to the second circuit.

The first circuit and the second circuit can include a fifth transistor, a second capacitor, and a light-emitting device as the display device, and can have a structure in which a gate of the fifth transistor is electrically connected to the third transistor or the fourth transistor, one of a source and a drain of the fifth transistor is electrically connected to one electrode of the light-emitting device, the one electrode of the light-emitting device is electrically connected to one electrode of the second capacitor, and the other electrode of the second capacitor is electrically connected to the gate of the fifth transistor.

The first circuit and the second circuit can include a liquid crystal device as the display device, and can have a structure in which one electrode of the liquid crystal device is electrically connected to the other of the source and the drain of the third transistor or the fourth transistor. Furthermore, a third capacitor may be included, and one electrode of the third capacitor may be electrically connected to the one electrode of the liquid crystal device.

The first capacitor may include a fifth capacitor and a sixth capacitor, and the fifth capacitor and the sixth capacitor may be connected in parallel.

It is preferable that the transistors in the first pixel circuit and the second pixel circuit each include a metal oxide in a channel formation region, and the metal oxide contain In, Zn, and M (M is Al, Ti, Ga, Ge, Sn, Y, Zr, La, Ce, Nd, or Hf).

Effect of the Invention

With the use of one embodiment of the present invention, a display apparatus capable of supplying a high voltage to a display device can be provided. Alternatively, a display apparatus capable of supplying a voltage higher than or equal to the output voltage of a source driver to a display device can be provided. Alternatively, a display apparatus capable of enhancing the luminance of a displayed image can be provided. Alternatively, a display apparatus in which the aperture ratio of a pixel can be increased can be provided.

Alternatively, a display apparatus with low power consumption can be provided. Alternatively, a highly reliable display apparatus can be provided. Alternatively, a novel display apparatus or the like can be provided. Alternatively, a method for operating any of the above display apparatuses can be provided. Alternatively, a novel semiconductor device or the like can be provided.

BRIEF DESCRIPTION OF THE DRAWINGS

FIG. 12A and FIG. 12B are diagrams illustrating display apparatuses.
FIG. 14A and FIG. 14B are diagrams illustrating display apparatuses.
FIG. 15A and FIG. 15B are diagrams illustrating display apparatuses.
FIG. 17A1 to FIG. 17C2 are diagrams illustrating transistors.
FIG. 18A1 to FIG. 18C2 are diagrams illustrating transistors.
FIG. 19A1 to FIG. 19C2 are diagrams illustrating transistors.
FIG. 20A1 to FIG. 20C2 are diagrams illustrating transistors.

MODE FOR CARRYING OUT THE INVENTION

Figure 1:
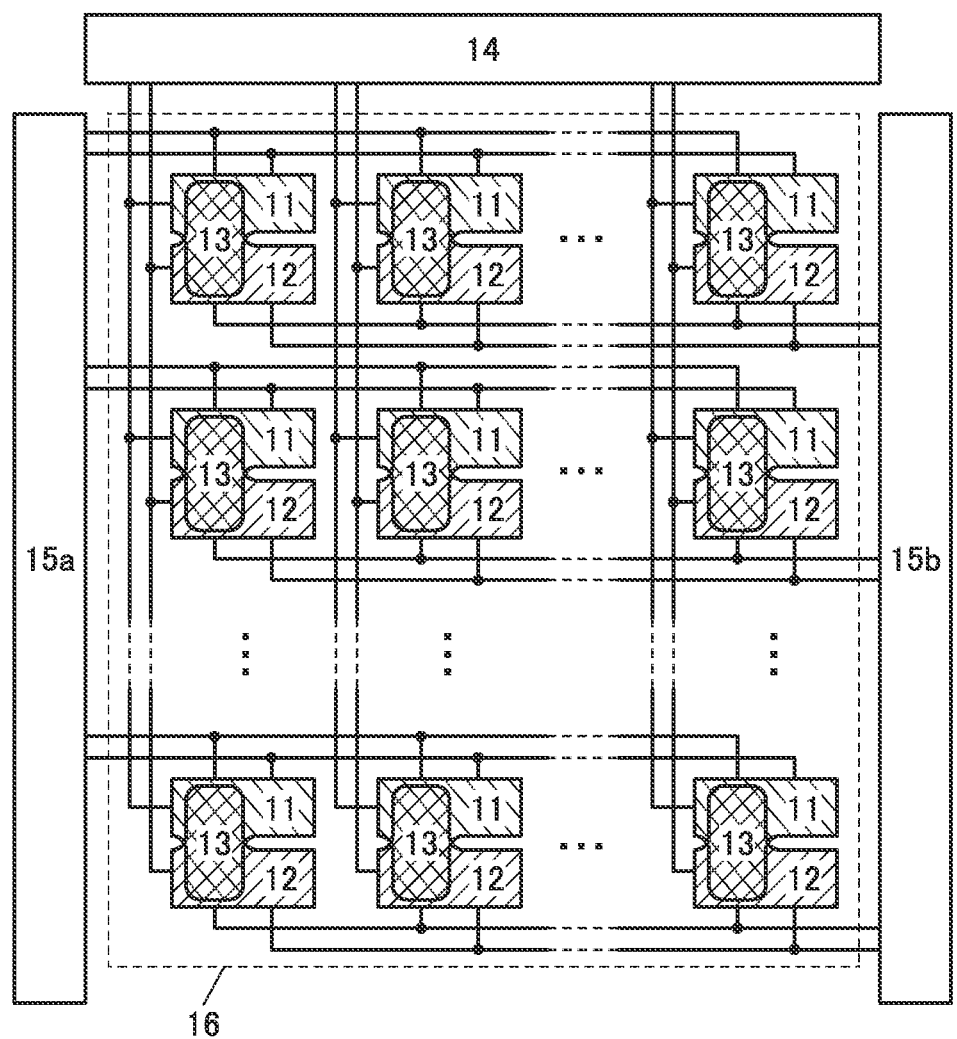
FIG. 1 is a diagram illustrating a display apparatus.

Embodiments are described in detail with reference to the drawings. However, the present invention is not limited to the following description, and it is readily appreciated by those skilled in the art that modes and details can be modified in various ways without departing from the spirit and the scope of the present invention. Therefore, the present invention should not be interpreted as being limited to the description of embodiments below. Note that in structures of the invention described below, the same portions or portions having similar functions are denoted by the same reference numerals in different drawings, and the description thereof is not repeated in some cases. Note that the hatching of the same component that constitutes a drawing is omitted or changed as appropriate in different drawings in some cases.

Even in the case where a single component is illustrated in a circuit diagram, the component may be composed of a plurality of parts as long as there is no functional inconvenience. For example, in some cases, a plurality of transistors that operate as a switch are connected in series or in parallel. In some cases, capacitors are separately arranged in a plurality of positions.

One conductor has a plurality of functions such as a wiring, an electrode, and a terminal in some cases, and in this specification, a plurality of names are used for the same component in some cases. Even in the case where components are illustrated in a circuit diagram as if they were directly connected to each other, the components may actually be connected to each other through a plurality of conductors; in this specification, even such a configuration is included in direct connection.

Embodiment 1

In this embodiment, a display apparatus that is one embodiment of the present invention will be described with reference to drawings.

One embodiment of the present invention is a display apparatus in which a pixel having a function of adding data is provided. The pixel has a function of retaining first data, a function of adding second data to the first data to generate third data, and a function of supplying the third data to a display device. Thus, a voltage higher than or equal to the output voltage of a source driver can be supplied to the display device.

Capacitive coupling by a capacitor is used for data addition. In one embodiment of the present invention, two pixels provided in the vertical direction (the direction in which a source line extends) share components including the capacitor; thus, the area where the two pixels are provided can be assigned to the capacitor, which can increase the capacitance value. Thus, the data addition by the capacitive coupling can be efficiently performed.

FIG. 1 is a diagram illustrating a display apparatus of one embodiment of the present invention. The display apparatus includes a source driver 14, gate drivers 15a and 15b, and a pixel array 16. The pixel array 16 includes pixels 11 and pixels 12 arranged in the column direction and the row direction.

The source driver 14 is electrically connected to the pixels 11 and the pixels 12. The gate driver 15a can be electrically connected to the pixels 11, for example. The gate driver 15b can be electrically connected to the pixels 12, for example. Note that the connection mode of the gate drivers 15a and 15b is not limited to the above, and a given connection mode with transistors included in the pixels 11 and the pixels 12 can be employed. Although an example in which two gate drivers are provided to face each other with the pixel array 16 provided therebetween is illustrated, the pixels 11 and the pixels 12 may be driven by one gate driver.

The pixels 11 and the pixels 12 are provided adjacent to each other in the vertical direction (the direction in which a source line extends). The pixels 11 and the pixels 12 have the same circuit structure and share circuits 13.

The pixels 11 and the pixels 12 each have a function of adding supplied data. The addition operation can be performed in the circuits 13.

Figure 2:
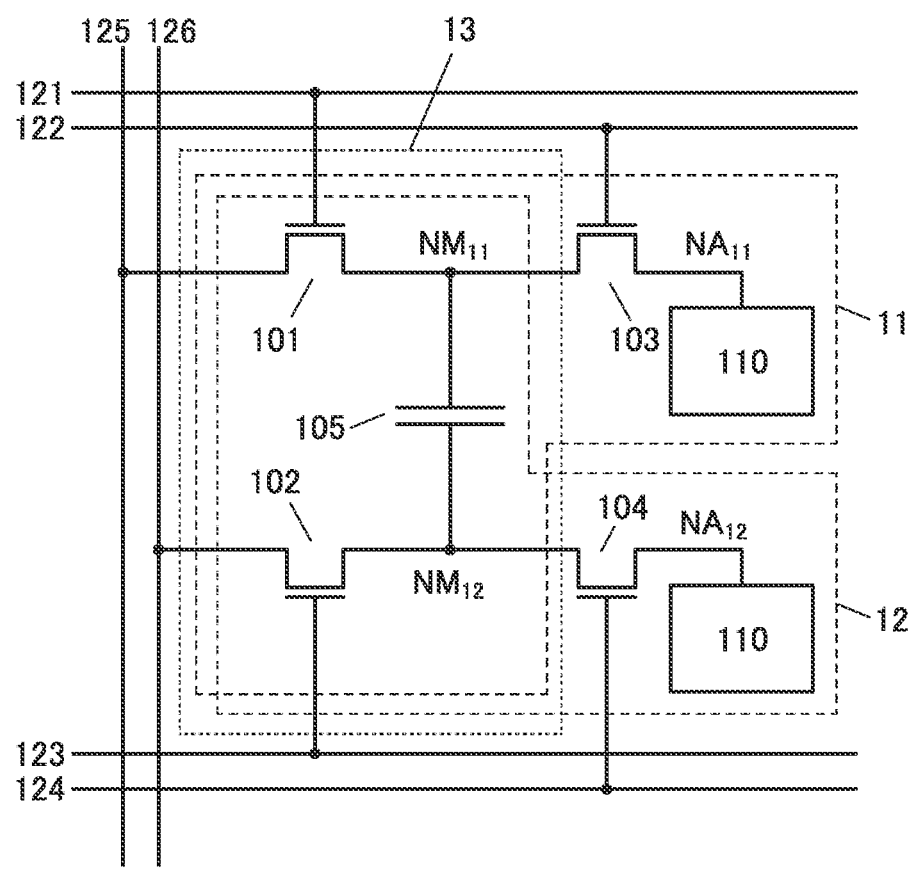
FIG. 2 is a diagram illustrating a pixel circuit.

FIG. 2 illustrates specific examples of the pixel 11 and the pixel 12. The pixel 11 includes a transistor 101, a transistor 102, a transistor 103, a capacitor 105, and a circuit 110. The pixel 12 includes the transistor 101, the transistor 102, a transistor 104, the capacitor 105, and the circuit 110. Note that the circuit 110 can have a structure including a transistor, a capacitor, a display device, and the like, and is provided in each pixel.

One of a source and a drain of the transistor 101 is electrically connected to one electrode of the capacitor 105. The one electrode of the capacitor 105 is electrically connected to one of a source and a drain of the transistor 103. The other of the source and the drain of the transistor 103 is electrically connected to the circuit 110 of the pixel 11. The other electrode of the capacitor 105 is electrically connected to one of a source and a drain of the transistor 102. The one of the source and the drain of the transistor 102 is electrically connected to one of a source and a drain of the transistor 104. The other of the source and the drain of the transistor 104 is electrically connected to the circuit 110 of the pixel 12.

Connections between the components of the pixel 11 and the pixel 12 and a variety of wirings are described. A gate of the transistor 101 is electrically connected to a wiring 121. A gate of the transistor 102 is electrically connected to a wiring 123. A gate of the transistor 103 is electrically connected to a wiring 122. A gate of the transistor 104 is electrically connected to a wiring 124.

The other of the source and the drain of the transistor 101 is electrically connected to a wiring 125. The other of the source and the drain of the transistor 102 is electrically connected to a wiring 126.

The wirings 121, 122, 123, and 124 have functions of gate lines and can be electrically connected to the gate driver 15a or the gate driver 15b. The wirings 125 and 126 have functions of source lines and can be electrically connected to the source driver 14 (see FIG. 1).

Here, a wiring that connects the one of the source and the drain of the transistor 101, the one electrode of the capacitor 105, and the one of the source and the drain of the transistor 103 is referred to as a node $NM_{11}$. A wiring that connects the one of the source and the drain of the transistor 102, the other electrode of the capacitor 105, and the one of the source and the drain of the transistor 104 is referred to as a node $NM_{12}$. A wiring that connects the transistor 103 and the circuit 110 is referred to as a node $NA_{11}$. A wiring that connects the transistor 104 and the circuit 110 is referred to as a node $NA_{12}$.

The node $NA_{11}$ and the node $NA_{12}$ can be floating, and the display device included in the circuit 110 operates in accordance with the potential of the node $NA_{11}$ or the node $NA_{12}$.

The transistor 101, the transistor 102, and the capacitor 105 correspond to the circuit 13 shared by the pixel 11 and the pixel 12. The circuit 13 has a function of adding data. In the pixel 11, by capacitive coupling between first data written to the node $NM_{11}$ and second data written to the node $NM_{12}$, third data is generated in the node $NM_{11}$. In the pixel 12, by capacitive coupling between first data written to the node $NM_{12}$ and second data written to the node $NM_{11}$, third data is generated in the node $NM_{12}$.

Since the pixel 11 and the pixel 12 share the capacitor 105, the area where the capacitor is provided can be large as compared with the case where a capacitor is provided in each pixel to form one circuit. That is, the electrode area of the capacitor 105 can be increased, thereby increasing the capacitance value.

In the pixel 11, first, the first data (weight: W) is written to the node $NM_{11}$. At this time, a reference potential "$V_{ref}$" is supplied to the node $NM_{12}$, and the capacitor 105 is made to retain a potential "$W-V_{ref}$". Next, the node $NM_{11}$ is set to be floating and the second data (data: D) is supplied to the node $NM_{12}$.

At this time, when the capacitance value of the capacitor 105 is $C_{105}$ and the capacitance value of the node $NM_{11}$ (including the capacitance value of the node $NA_{11}$) is $C_{NM11}$, the potential of the node $NM_{11}$ becomes $W+(C_{105}/(C_{105}+C_{NM11}))\times(D-V_{ref})$. Here, when the value of $C_{105}$ is made large and the value of $C_{NM11}$ becomes negligible, the potential of the node $NM_{11}$ becomes "$W+D-V_{ref}$". In one embodiment of the present invention, it is possible to increase the electrode area of the capacitor 105 to increase the capacitance value $C_{105}$ as described above, so that data addition can be performed efficiently.

Therefore, when "W"="D", "$V_{ref}$"=0 V, and $C_{105}$ is sufficiently larger than $C_{NM11}$, the potential of the node $NM_{11}$ becomes closer to "2D". In other words, the third data ("2D"), which is a potential approximately twice the output of the source driver 14, can be supplied to the node $NM_{11}$.

In the pixel 12, first, the first data (weight: W) is written to the node $NM_{12}$. At this time, the reference potential "$V_{ref}$" is supplied to the node $NM_{11}$, and the capacitor 105 is made to retain "$W-V_{ref}$". Next, the node $NM_{12}$ is set to be floating and the second data (data: D) is supplied to the node $NM_{11}$.

At this time, when the capacitance value of the capacitor 105 is $C_{105}$ and the capacitance value of the node $NM_{12}$ (including the capacitance value of the node $NA_{12}$) is $C_{NM12}$, the potential of the node $NM_{12}$ becomes $W+(C_{105}/(C_{105}+C_{NM12}))\times(D-V_{ref})$. Here, when the value of $C_{105}$ is made large and the value of $C_{NM12}$ becomes negligible, the potential of the node $NM_{12}$ becomes "$W+D-V_{ref}$".

Therefore, when "W"="D", "$V_{ref}$"=0 V, and $C_{105}$ is sufficiently larger than $C_{NM12}$, the potential of the node $NM_{12}$ becomes closer to "2D".

Note that in the pixels 11 and 12, when "$V_{ref}$" is "-W" or "-D" and "-W"="-D", the potential of the node $NM_{11}$ can be made close to "3D".

By such an action, a high voltage can be generated even using a general-purpose driver IC. For example, a liquid crystal device that requires a high voltage for gray level control can be driven. Alternatively, since a voltage that is supplied from the source driver 14 in order to drive a general liquid crystal device or light-emitting device can be reduced to approximately ½ or approximately ⅓, the power consumption of the display apparatus can be reduced.

The node $NM_{11}$, the node $NM_{12}$, the node $NA_{11}$, and the node $NA_{12}$ function as storage nodes. When the transistor connected to the corresponding node is brought into conduction, data can be written to the node. When the transistor is brought into non-conduction, the data can be retained in the node. The use of a transistor with an extremely low off-state current as the transistor enables leakage current to be reduced and the potential of the node to be retained for a long time. As the transistor, a transistor using a metal oxide in a channel formation region (hereinafter, OS transistor) can be used, for example.

Specifically, OS transistors are preferably used as any or all of the transistors 101, 102, 103, and 104. An OS transistor may also be used for a component included in the circuit 110. In the case of operating within a range where the amount of leakage current is acceptable, a transistor containing Si in a channel formation region (hereinafter, Si transistor) may be used. Alternatively, an OS transistor and a Si transistor may be used together. Examples of the Si transistor include a transistor containing amorphous silicon and a transistor containing crystalline silicon (microcrystalline silicon, low-temperature polysilicon, or single crystal silicon).

As a semiconductor material used for an OS transistor, a metal oxide whose energy gap is greater than or equal to 2 eV, preferably greater than or equal to 2.5 eV, further preferably greater than or equal to 3 eV can be used. A typical example is an oxide semiconductor containing indium, and a CAAC-OS or a CAC-OS described later can be used, for example. A CAAC-OS has a crystal structure including stable atoms and is suitable for a transistor that is required to have high reliability, and the like. A CAC-OS has high mobility and is suitable for a transistor that operates at high speed, and the like.

In an OS transistor, a semiconductor layer has a large energy gap, and thus the OS transistor has an extremely low off-state current of several yoctoamperes per micrometer (current per micrometer of a channel width). An OS transistor has features such that impact ionization, an avalanche breakdown, a short-channel effect, or the like does not occur, which are different from those of a Si transistor, and thus can configure a circuit having a high withstand voltage and high reliability. Moreover, variations in electrical characteristics due to crystallinity unevenness, which are caused in Si transistors, are less likely to occur in OS transistors.

A semiconductor layer included in the OS transistor can be, for example, a film represented by an In—M—Zn-based oxide that contains indium, zinc, and M (a metal such as aluminum, titanium, gallium, germanium, yttrium, zirconium, lanthanum, cerium, tin, neodymium, or hafnium). The In—M—Zn-based oxide can be typically formed by a sputtering method. Alternatively, the In—M—Zn-based oxide can be formed by an ALD (Atomic layer deposition) method.

It is preferable that the atomic ratio of metal elements in a sputtering target used to form the In—M—Zn oxide by a sputtering method satisfy In≥M and Zn≥M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio in the formed semiconductor layer varies from the above atomic ratio of metal elements in the sputtering target in a range of ±40%.

An oxide semiconductor with low carrier density is used for the semiconductor layer. For example, the semiconductor layer may use an oxide semiconductor whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$. Such an oxide semiconductor is referred to as a highly purified intrinsic or substantially highly purified intrinsic oxide semiconductor. The oxide semiconductor has a low density of defect states and can thus be regarded as an oxide semiconductor having stable characteristics.

Note that, without limitation to these, an oxide semiconductor with an appropriate composition may be used in accordance with required semiconductor characteristics and electrical characteristics (e.g., field-effect mobility and threshold voltage) of the transistor. To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When the oxide semiconductor in the semiconductor layer contains silicon or carbon, which is an element belonging to Group 14, oxygen vacancies are increased, and the semiconductor layer becomes n-type. Thus, the concentration of silicon or carbon (the concentration obtained by secondary ion mass spectrometry (SIMS)) in the semiconductor layer is set to $2\times10^{18}$ atoms/$cm^3$ or lower, preferably $2\times10^{17}$ atoms/$cm^3$ or lower.

Alkali metal and alkaline earth metal might generate carriers when bonded to an oxide semiconductor, in which case the off-state current of the transistor might be increased. Thus, the concentration of alkali metal or alkaline earth metal in the semiconductor layer (the concentration obtained by SIMS) is set to $1\times10^{18}$ atoms/$cm^3$ or lower, preferably $2\times10^{16}$ atoms/$cm^3$ or lower.

When the oxide semiconductor in the semiconductor layer contains nitrogen, electrons functioning as carriers are generated and the carrier density increases, so that the semiconductor layer easily becomes n-type. As a result, a transistor using an oxide semiconductor that contains nitrogen is likely to have normally-on characteristics. Hence, the concentration of nitrogen in the semiconductor layer (the concentration obtained by SIMS) is preferably set to $5\times10^{18}$ atoms/$cm^3$ or lower.

When the oxide semiconductor in the semiconductor layer contains hydrogen, hydrogen reacts with oxygen bonded to a metal atom to be water, and thus sometimes causes an oxygen vacancy in the oxide semiconductor. When the channel formation region in the oxide semiconductor includes oxygen vacancies, the transistor sometimes has normally-on characteristics. In some cases, a defect that is an oxygen vacancy into which hydrogen enters functions as a donor and generates an electron serving as a carrier. In other cases, bonding of part of hydrogen to oxygen bonded to a metal atom generates electrons serving as carriers. Thus, a transistor using an oxide semiconductor that contains a large amount of hydrogen is likely to have normally-on characteristics.

A defect in which hydrogen has entered an oxygen vacancy can function as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration in the oxide semiconductor obtained by SIMS is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When an oxide semiconductor with sufficiently reduced impurities such as hydrogen is used for a channel formation region of a transistor, stable electrical characteristics can be given.

The semiconductor layer may have a non-single-crystal structure, for example. Examples of a non-single-crystal structure include a CAAC-OS (C-Axis Aligned Crystalline Oxide Semiconductor) including a c-axis aligned crystal, a polycrystalline structure, a microcrystalline structure, and an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. In another example, an oxide film having an amorphous structure has a completely amorphous structure and no crystal part.

Note that the semiconductor layer may be a mixed film including two or more of a region having an amorphous structure, a region having a microcrystalline structure, a region having a polycrystalline structure, a region of CAAC-OS, and a region having a single crystal structure. The mixed film has, for example, a single-layer structure or a layered structure including two or more of the foregoing regions in some cases.

The composition of a CAC (Cloud-Aligned Composite)-OS, which is one embodiment of a non-single-crystal semiconductor layer, is described below.

The CAC-OS has, for example, a composition of a material in which elements contained in an oxide semiconductor are unevenly distributed to have a size greater than or equal to 0.5 nm and less than or equal to 10 nm, preferably greater than or equal to 1 nm and less than or equal to 2 nm, or a similar size. Note that in the following description, a state in which one or more metal elements are unevenly distributed and regions containing the metal element(s) are mixed to have a size greater than or equal to 0.5 nm and less than or equal to 10 nm, preferably greater than or equal to 1 nm and less than or equal to 2 nm, or a similar size in an oxide semiconductor is referred to as a mosaic pattern or a patch-like pattern.

Note that an oxide semiconductor preferably contains at least indium. In particular, indium and zinc are preferably contained. In addition, one or more kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For instance, a CAC-OS in an In—Ga—Zn oxide (an In—Ga—Zn oxide in the CAC-OS may be particularly referred to as CAC-IGZO) has a composition in which materials are separated into indium oxide (hereinafter, InO$_{X1}$ (X1 is a real number greater than 0)) or indium zinc oxide (hereinafter, In$_{X2}$Zn$_{Y2}$O$_{Z2}$ (X2, Y2, and Z2 are real numbers greater than 0)) and gallium oxide (hereinafter, GaO$_{X3}$ (X3 is a real number greater than 0)) or gallium zinc oxide (hereinafter, Ga$_{X4}$Zn$_{Y4}$O$_{Z4}$ (X4, Y4, and Z4 are real numbers greater than 0)), for example, so that a mosaic pattern is formed, and mosaic-like InO$_{X1}$ or In$_{X2}$Zn$_{Y2}$O$_{Z2}$ is evenly distributed in the film (which is hereinafter also referred to as cloud-like).

That is, the CAC-OS is a composite oxide semiconductor with a composition in which a region containing GaO$_{X3}$ as a main component and a region containing In$_{X2}$Zn$_{Y2}$O$_{Z2}$ or InO$_{X1}$ as a main component are mixed. Note that in this specification, when the atomic ratio of In to an element M in a first region is greater than the atomic ratio of In to the element M in a second region, for example, the first region is regarded as having higher In concentration than the second region.

Note that IGZO is a commonly known name and sometimes refers to one compound formed of In, Ga, Zn, and O. A typical example is a crystalline compound represented by InGaO$_3$(ZnO)$_{m1}$ (m1 is a natural number) or In$_{(1+x0)}$Ga$_{(1-x0)}$O$_3$(ZnO)$_{m0}$ ($-1 \leq x0 \leq 1$; m0 is a given number).

The above crystalline compound has a single crystal structure, a polycrystalline structure, or a CAAC structure. Note that the CAAC structure is a crystal structure in which a plurality of IGZO nanocrystals have c-axis alignment and are connected in the a-b plane direction without alignment.

The CAC-OS relates to the material composition of an oxide semiconductor. The CAC-OS refers to a composition in which, in the material composition containing In, Ga, Zn, and O, some regions that contain Ga as a main component and are observed as nanoparticles and some regions that contain In as a main component and are observed as nanoparticles are randomly dispersed in a mosaic pattern. Therefore, the crystal structure is a secondary element for the CAC-OS.

Note that the CAC-OS is regarded as not including a layered structure of two or more kinds of films with different compositions. For example, a two-layer structure of a film containing In as a main component and a film containing Ga as a main component is not included.

Note that a clear boundary cannot sometimes be observed between the region containing GaO$_{X3}$ as a main component and the region containing In$_{X2}$Zn$_{Y2}$O$_{Z2}$ or InO$_{X1}$ as a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that contain the metal element(s) as a main component and are observed as nanoparticles and some regions that contain In as a main component and are observed as nanoparticles are randomly dispersed in a mosaic pattern.

The CAC-OS can be formed by a sputtering method under a condition where a substrate is not heated intentionally, for example. In the case of forming the CAC-OS by a sputtering method, any one or more selected from an inert gas (typically, argon), an oxygen gas, and a nitrogen gas are used as a deposition gas. The ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an Out-of-plane method, which is one of X-ray diffraction (XRD)

measurement methods. That is, it is found from the X-ray diffraction measurement that no alignment in the a-b plane direction and the c-axis direction is observed in a measured region.

In an electron diffraction pattern of the CAC-OS which is obtained by irradiation with an electron beam with a probe diameter of 1 nm (also referred to as a nanobeam electron beam), a ring-like high-luminance region (ring region) and a plurality of bright spots in the ring region are observed. It is therefore found from the electron diffraction pattern that the crystal structure of the CAC-OS includes an nc (nanocrystal) structure with no alignment in the plan-view direction and the cross-sectional direction.

Moreover, for example, it can be confirmed by EDX mapping obtained using energy dispersive X-ray spectroscopy (EDX) that the CAC-OS in the In—Ga—Zn oxide has a composition in which regions containing $GaO_{X3}$ as a main component and regions containing $In_{X2}Zn_{Y2}O_{Z2}$ or $InO_{X1}$ as a main component are unevenly distributed and mixed.

The CAC-OS has a composition different from that of an IGZO compound in which the metal elements are evenly distributed, and has characteristics different from those of the IGZO compound. That is, the CAC-OS has a composition in which regions containing $GaO_{X3}$ or the like as a main component and regions containing $In_{X2}Zn_{Y2}O_{Z2}$ or $InO_{X1}$ as a main component are phase-separated from each other and form a mosaic pattern.

Here, a region containing $In_{X2}Zn_{Y2}O_{Z2}$ or $InO_{X1}$ as a main component is a region whose conductivity is higher than that of a region containing $GaO_{X3}$ or the like as a main component. In other words, when carriers flow through the regions containing $In_{X2}Zn_{Y2}O_{Z2}$ or $InO_{X1}$ as a main component, the conductivity of an oxide semiconductor is exhibited. Accordingly, when the regions containing $In_{X2}Zn_{Y2}O_{Z2}$ or $InO_{X1}$ as a main component are distributed in an oxide semiconductor like a cloud, high field-effect mobility ($\mu$) can be achieved.

By contrast, a region containing $GaO_{X3}$ or the like as a main component is a region whose insulating property is higher than that of a region containing $In_{X2}Zn_{Y2}O_{Z2}$ or $InO_{X1}$ as a main component. In other words, when regions containing $GaO_{X3}$ or the like as a main component are distributed in an oxide semiconductor, leakage current can be suppressed and favorable switching operation can be achieved.

Accordingly, when the CAC-OS is used for a semiconductor device, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and high field-effect mobility ($\mu$) can be achieved.

A semiconductor device using the CAC-OS has high reliability. Thus, the CAC-OS is suitably used as a constituent material of a variety of semiconductor devices.

Figure 3:
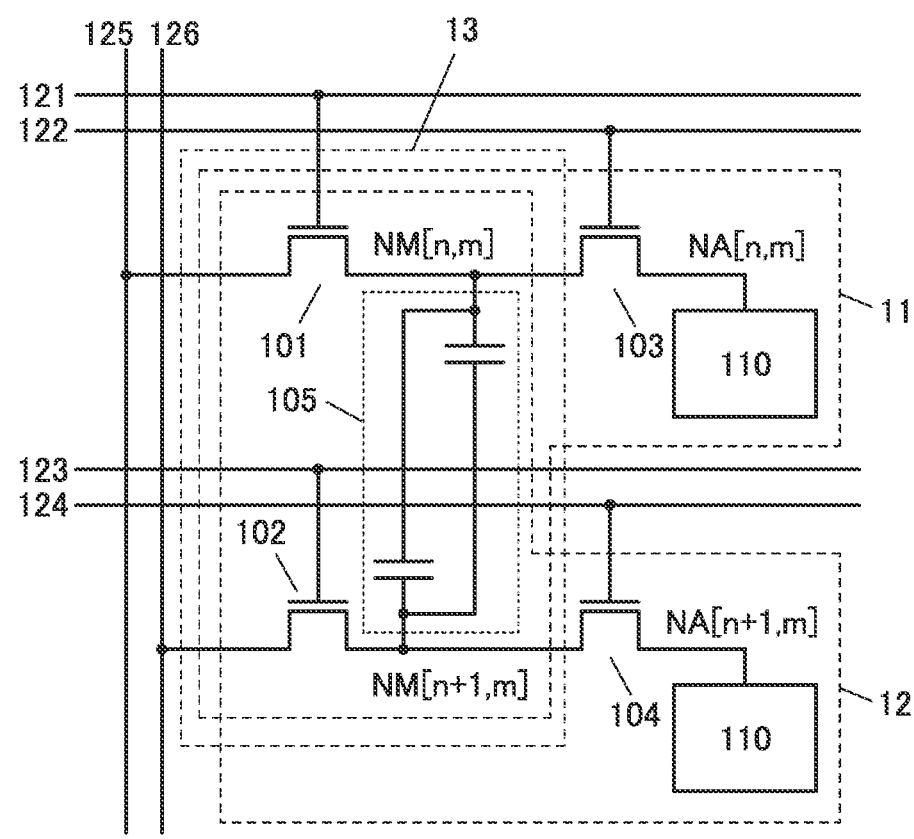
FIG. 3 is a diagram illustrating a pixel circuit.

Note that in the pixel circuit of one embodiment of the present invention, the capacitor 105 may consist of a plurality of capacitors connected in parallel. For example, as illustrated in FIG. 3, two capacitors can be connected in parallel using a wiring serving as a bridge between the gate wirings (the wirings 123 and 125). This structure enables the gate wirings to be separately provided; thus, the display quality of a small-sized panel or the like with high resolution can be especially improved. Note that even when the gate wirings are collectively provided between the pixels as illustrated in FIG. 1 and FIG. 2, the display quality of a large-sized panel with a sufficiently large pixel size with respect to the widths of the wirings can be high.

Figure 4:
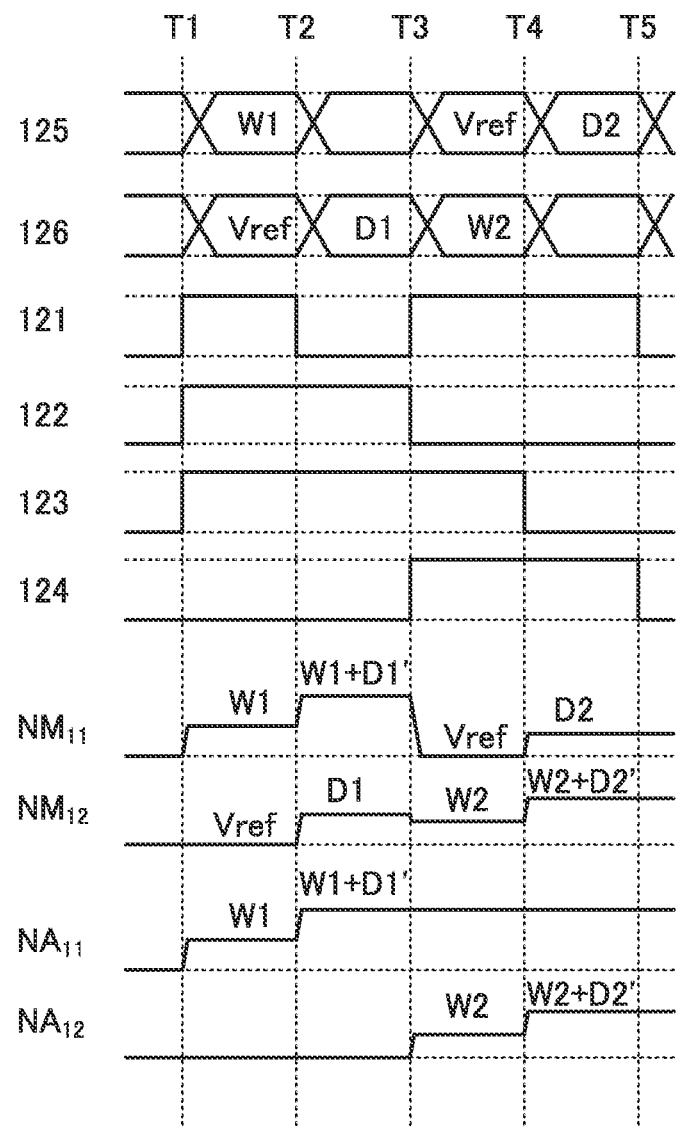
FIG. 4 is a timing chart showing the operation of a pixel circuit.

Next, a method for supplying a data potential, which is approximately twice a data potential output from the source driver, to the display device by operations of the pixel 11 and the pixel 12 will be described with reference to a timing chart in FIG. 4.

Note that in the following description, a high potential is represented by "H" and a low potential is represented by "L". In addition, weight supplied to the pixel 11 is "W1", image data supplied to the pixel 11 is "D1", weight supplied to the pixel 12 is "W2", and image data supplied to the pixel 12 is "D2". As "$V_{ref}$", 0 V, a GND potential, or a certain reference potential can be used, for example.

Note that in potential distribution, potential coupling, or potential loss, detailed changes due to a circuit structure, operation timing, or the like are not considered. In addition, a potential change due to capacitive coupling using the capacitor depends on the capacitance ratio of the capacitor to a component connected to the capacitor; however, for clarity of description, the capacitance values of the node $NM_{11}$, the node $NM_{12}$, the node $NA_{11}$, and the node $NA_{12}$ are assumed to be sufficiently small.

At Time T1, "W1" is supplied to the wiring 125, "$V_{ref}$" is supplied to the wiring 126, the potential of the wiring 121 is set to "H", the potential of the wiring 122 is set to "H", the potential of 123 is set to "H", and the potential of the wiring 124 is set to "L", whereby the transistor 102 is brought into conduction and the potential of the node $NM_{12}$ becomes "$V_{ref}$". This operation is a reset operation for an addition operation (capacitive coupling operation) to be performed later.

Furthermore, the transistors 101 and 103 are brought into conduction, and the potential of the wiring 125 is written to the node $NM_{11}$ and the node $NA_{11}$. This operation is a weight writing operation in the pixel 11, and the potentials of the node $NM_{11}$ and the node $NA_{11}$ become "W1".

At Time T2, the potential of the wiring 121 is set to "L", the potential of the wiring 122 is set to "H", the potential of the wiring 123 is set to "H", and the potential of the wiring 124 is set to "L", whereby the transistor 101 is brought into non-conduction. At this time, "W1" is retained in the node $NM_{11}$ and the node $NA_{11}$. In addition, "$W1-V_{ref}$" is retained in the capacitor 105.

When "D1" is supplied to the wiring 126, the potential of the node $NM_{12}$ becomes "D1", and "$(D1-V_{ref})$'" corresponding to the capacitance ratio of the capacitor 105 to the node $NM_{11}$+the node $NA_{11}$ is added to the node $NM_{11}$ and the node $NA_{11}$. This operation is an addition operation in the pixel 11, and the potentials of the node $NM_{11}$ and the node $NA_{11}$ become "$W1+(D1-V_{ref})$'". When "$V_{ref}$"=0 at this time, the potentials of the node $NM_{11}$ and the node $NA_{11}$ become "W1+D1'". The potential of the node $NA_{11}$ is supplied to the display device, and an image is displayed.

When W1=D1 and the capacitance of the node $NM_{11}$ and the node $NA_{11}$ is sufficiently smaller than the capacitance of the capacitor 105, "W1+D1'" becomes a value close to "2D1". Thus, a data potential approximately twice the data potential output from the source driver can be supplied to the display device.

At Time T3, the potential of the wiring 122 is set to "L", whereby the transistor 103 is brought into non-conduction, the potential of the node $NA_{11}$ is retained, and an image is displayed until an operation of the next frame. The above is the description of the operations of the pixel 11.

In addition, at Time T3, "$V_{ref}$" is supplied to the wiring 125, "W2" is supplied to the wiring 126, the potential of the wiring 121 is set to "H", the potential of 123 is set to "H", and the potential of the wiring 124 is set to "H", whereby the transistor 101 is brought into conduction and the potential of the node $NM_{11}$ becomes "$V_{ref}$". This operation is a reset operation for an addition operation (capacitive coupling operation) to be performed later.

Furthermore, the transistors 102 and 104 are brought into conduction, and the potential of the wiring 126 is written to the node $NM_{12}$ and the node $NA_{12}$. This operation is a weight writing operation in the pixel 12, and the potentials of the node $NM_{12}$ and the node $NA_{12}$ become "W2".

At Time T4, the potential of the wiring 121 is set to "H", the potential of the wiring 122 is set to "L", the potential of the wiring 123 is set to "L", and the potential of the wiring 124 is set to "H", whereby the transistor 102 is brought into non-conduction. At this time, "W2" is retained in the node $NM_{12}$ and the node $NA_{12}$. In addition, "W2–$V_{ref}$" is retained in the capacitor 105.

When "D2" is supplied to the wiring 125, the potential of the node $NM_{11}$ becomes "D2", and "(D2–$V_{ref}$)'" corresponding to the capacitance ratio of the capacitor 105 to the node $NM_{12}$+the node $NA_{12}$ is added to the node $NM_{12}$ and the node $NA_{12}$. This operation is an addition operation in the pixel 12, and the potentials of the node $NM_{12}$ and the node $NA_{12}$ become "W2+(D2–$V_{ref}$)'". When "$V_{ref}$"=0 at this time, the potentials of the node $NM_{12}$ and the node $NA_{12}$ become "W2+D2'". The potential of the node $NA_{12}$ is supplied to the display device, and an image is displayed.

When W1=D1 and the capacitance of the node $NM_{12}$ and the node $NA_{12}$ is sufficiently smaller than the capacitance of the capacitor 105, "W2+D2'" becomes a value close to "2D2". Thus, a data potential approximately twice the data potential output from the source driver can be supplied to the display device.

At Time T5, the potential of the wiring 121 is set to "L" and the potential of the wiring 124 is set to "L", whereby the transistor 104 is brought into non-conduction, the potential of the node $NA_{12}$ is retained, and an image is displayed until an operation of the next frame. The above is the description of the operations of the pixel 12.

FIG. 5A to FIG. 5D each illustrate an example of a structure including a light-emitting device as the display device, which can be used for the circuit 110. Note that the node $NA_{11}$ included in the pixel 11 is illustrated in each drawing as an example but may be replaced with the node $NA_{12}$ included in the pixel 12.

Figure 5A:
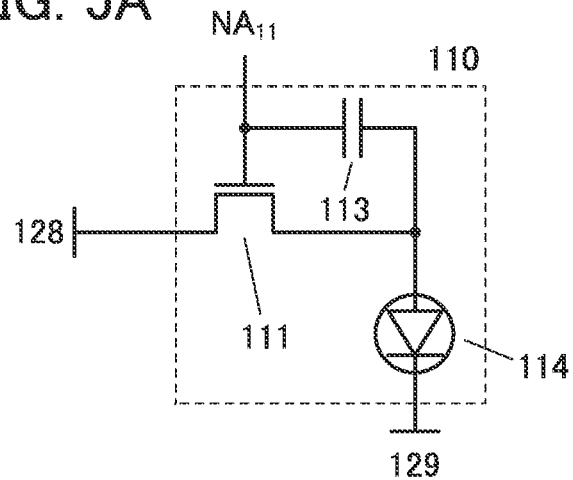
FIG. 5A to FIG. 5D are diagrams illustrating circuits.

The structure illustrated in FIG. 5A includes a transistor 111, a capacitor 113, and a light-emitting device 114. One of a source and a drain of the transistor 111 is electrically connected to one electrode of the light-emitting device 114. The one electrode of the light-emitting device 114 is electrically connected to one electrode of the capacitor 113. The other electrode of the capacitor 113 is electrically connected to a gate of the transistor 111. The gate of the transistor 111 is electrically connected to the node $NA_{11}$.

The other of the source and the drain of the transistor 111 is electrically connected to a wiring 128. The other electrode of the light-emitting device 114 is electrically connected to a wiring 129. The wirings 128 and 129 have a function of supplying power. For example, the wiring 128 is capable of supplying a high potential power. The wiring 129 is capable of supplying a low potential power.

Figure 5B:
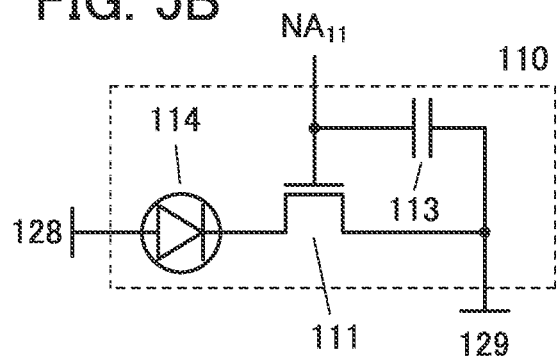

Alternatively, as illustrated in FIG. 5B, one electrode of the light-emitting device 114 may be electrically connected to the wiring 128, and the other electrode of the light-emitting device 114 may be electrically connected to the transistor 111 and the other of the source and the drain. This structure can also be used for other circuits 110 each including the light-emitting device 114.

Figure 5C:
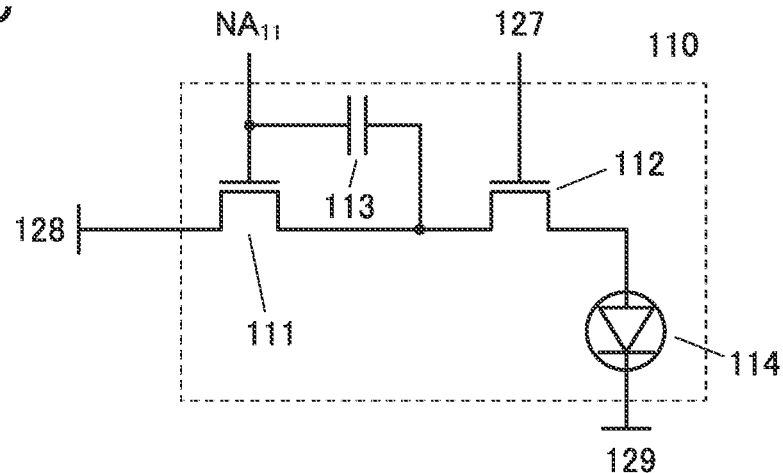

FIG. 5C is a structure in which a transistor 112 is added to the structure of FIG. 5A. One of a source and a drain of the transistor 112 is electrically connected to the one of the source and the drain of the transistor 111. The other of the source and the drain of the transistor 112 is electrically connected to the light-emitting device 114. A gate of the transistor 112 is electrically connected to a wiring 127. The wiring 127 can have a function of a signal line that controls the conduction of the transistor 112.

In this structure, current flows through the light-emitting device 114 when the potential of the node $NA_{11}$ is higher than or equal to the threshold voltage of the transistor 111 and the transistor 112 is brought into conduction. Thus, light emission of the light-emitting device 114 can be started at any time after the operation of adding the weight (W) and the data (D).

Figure 5D:
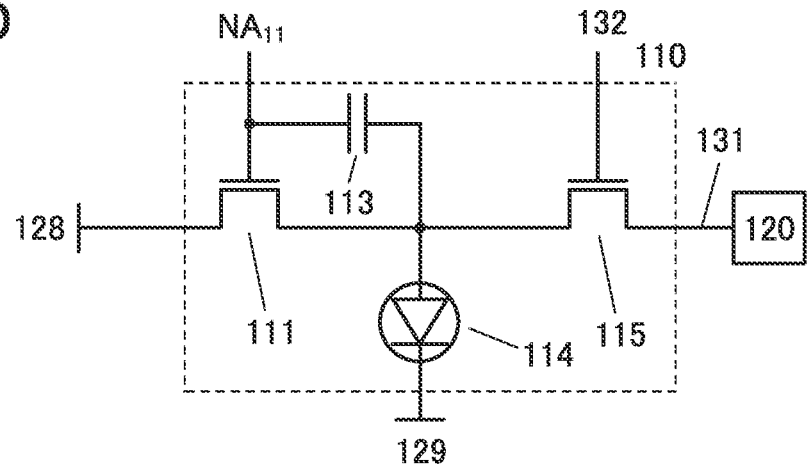

FIG. 5D is a structure in which a transistor 115 is added to the structure of FIG. 5A. One of a source and a drain of the transistor 115 is electrically connected to the one of the source and the drain of the transistor 111. The other of the source and the drain of the transistor 115 is electrically connected to a wiring 131. A gate of the transistor 115 is electrically connected to a wiring 132. The wiring 132 can have a function of a signal line that controls the conduction of the transistor 115.

The wiring 131 can be electrically connected to a supply source of a certain potential such as a reference potential. When a certain potential is supplied from the wiring 131 to the one of the source and the drain of the transistor 111, write of image data can be stable. Furthermore, the timing of light emission of the light-emitting device 114 can be controlled.

In addition, the wiring 131 can be connected to a circuit 120 and can also have a function of a monitor line. The circuit 120 can have one or more of a function of the supply source of a certain potential, a function of obtaining electrical characteristics of the transistor 111, and a function of generating correction data.

FIG. 6A to FIG. 6D each illustrate an example of a structure including a liquid crystal device as the display device, which can be used for the circuit 110.

Figure 6A:
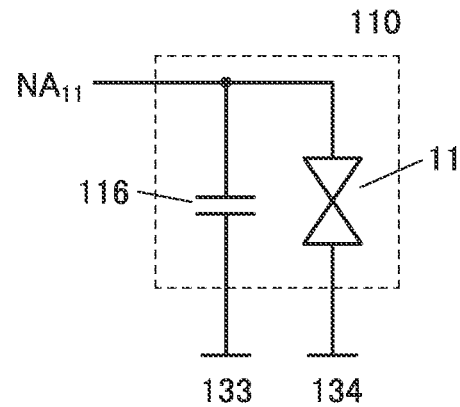
FIG. 6A to FIG. 6D are diagrams illustrating circuits.

The structure illustrated in FIG. 6A includes a capacitor 116 and a liquid crystal device 117. One electrode of the liquid crystal device 117 is electrically connected to one electrode of the capacitor 116. The one electrode of the capacitor 116 is electrically connected to the node $NA_{11}$.

The other electrode of the capacitor 116 is electrically connected to a wiring 133. The other electrode of the liquid crystal device 117 is electrically connected to a wiring 134. The wirings 133 and 134 have a function of supplying power. The wirings 133 and 134 are capable of supplying a reference potential such as GND or 0 V or a given potential, for example.

Figure 6B:
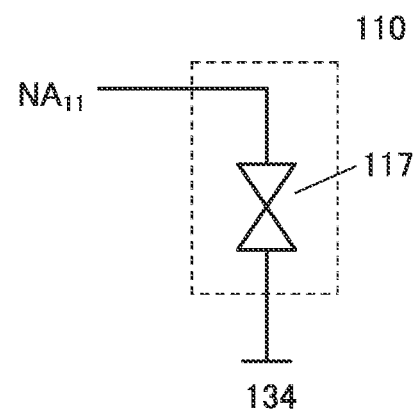

Note that a structure in which the capacitor 116 is omitted may be employed as illustrated in FIG. 6B. As described above, an OS transistor can be used as the transistor connected to the node $NA_{11}$. Since an OS transistor has an extremely low leakage current, an image can be displayed for a comparatively long time even when the capacitor 116 functioning as a storage capacitor is omitted. In addition, regardless of the transistor structure, omitting the capacitor 116 is effective in the case where a high-speed operation allows a shorter display period as in field-sequential driving. The aperture ratio can be improved by omitting the capacitor 116. Alternatively, the transmittance of the pixel can be improved.

Figure 6C:
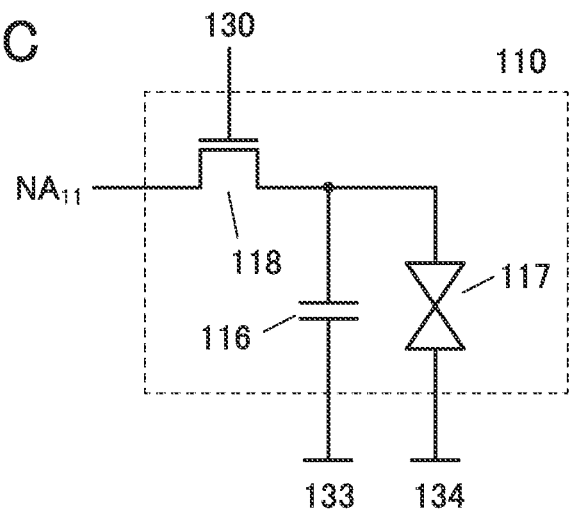

FIG. 6C illustrates a structure in which a transistor 118 is added to the structure of FIG. 6A. One of a source and a drain of the transistor 118 is electrically connected to the one electrode of the capacitor 116. The other of the source and the drain of the transistor 118 is electrically connected to the node $NA_{11}$. A gate of the transistor 118 is electrically connected to a wiring 130. The wiring 130 can have a function of a signal line that controls the conduction of the transistor 118.

In this structure, the potential of the node $NA_{11}$ is applied to the liquid crystal device 117 when the transistor 118 is brought into conduction. Thus, the operation of the liquid crystal device can be started at any time after the operation of adding the weight (W) and the data (D).

While the transistor 118 is in a non-conduction state, the potentials supplied to the capacitor 116 and the liquid crystal device 117 are retained continuously; thus, the potentials supplied to the capacitor 116 and the liquid crystal device 117 are preferably reset before image data is rewritten. For the reset, a reset potential is supplied to the wiring 125 (see FIG. 2) to bring the transistor 104 and the transistor 118 into conduction at the same time, for example.

Figure 6D:
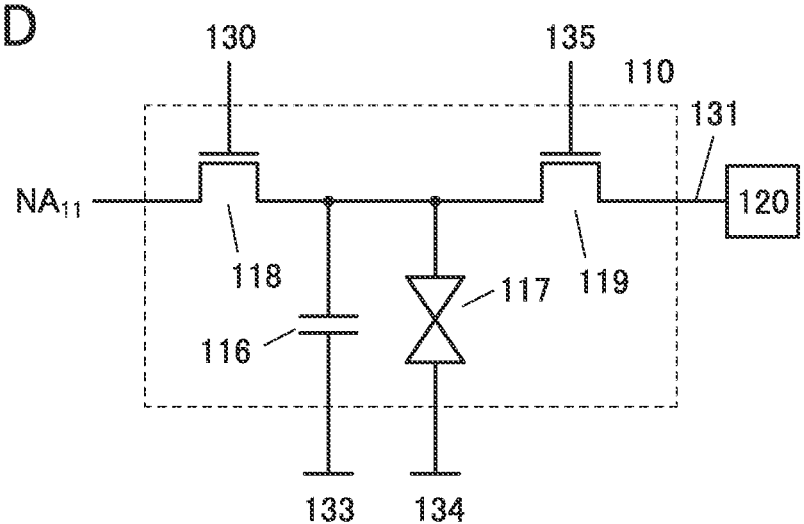

FIG. 6D illustrates a structure in which a transistor 119 is added to the structure of FIG. 6C. One of a source and a drain of the transistor 119 is electrically connected to the one electrode of the liquid crystal device 117. The other of the source and the drain of the transistor 119 is electrically connected to the wiring 131. A gate of the transistor 119 is electrically connected to a wiring 135. The wiring 135 can have a function of a signal line that controls the conduction of the transistor 119.

The circuit 120 electrically connected to the wiring 131 is as described above using FIG. 5C and may have a function of resetting the potentials supplied to the capacitor 116 and the liquid crystal device 117.

Figure 7:
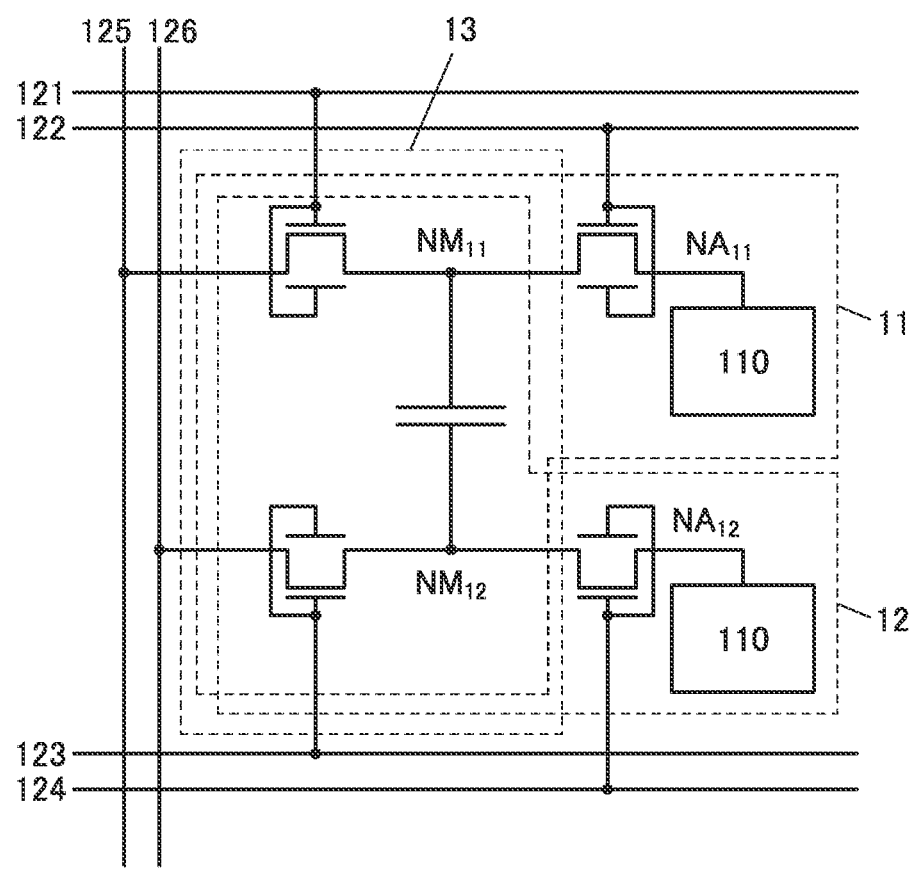
FIG. 7 is a diagram illustrating a pixel circuit.

In one embodiment of the present invention, as illustrated in an example of FIG. 7, a structure in which transistors are provided with back gates may be employed. FIG. 7 illustrates a structure in which back gates are electrically connected to front gates, which has an effect of increasing on-state currents. Alternatively, a structure in which the back gates are electrically connected to wirings capable of supplying a constant potential may be employed. This structure enables control of the threshold voltages of the transistors. The transistors included in the circuit 110 may also have back gates.

Figure 8A:
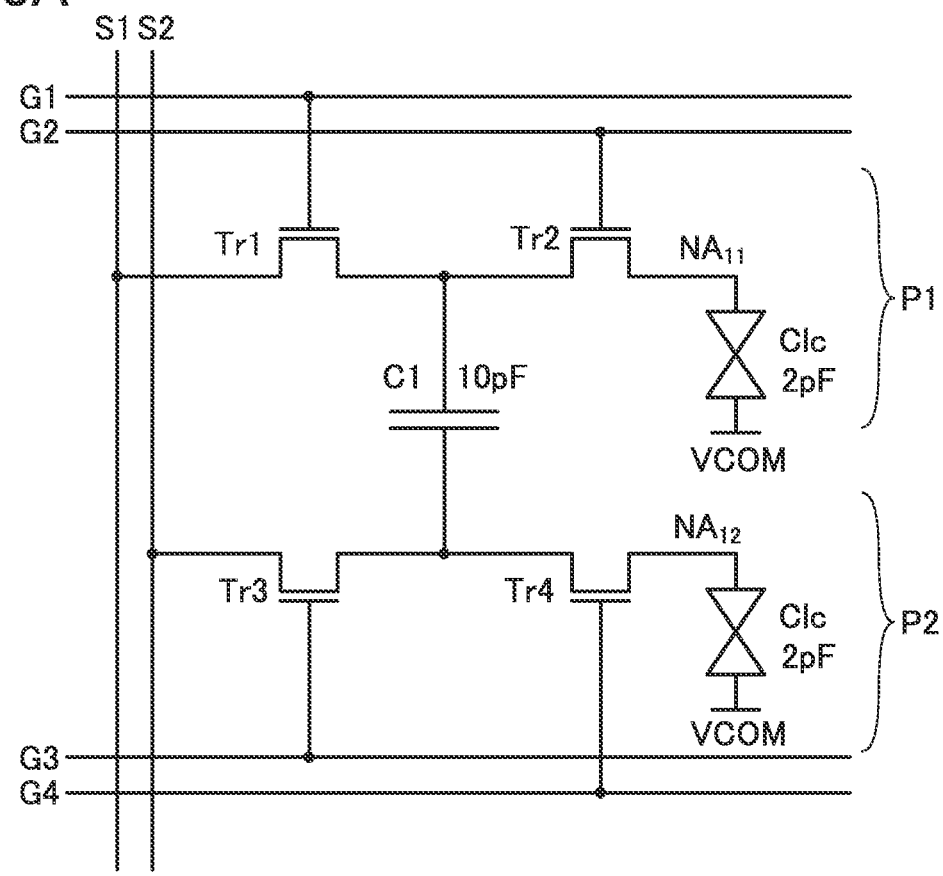
FIG. 8A is a diagram illustrating a pixel circuit used for simulation.

Next, simulation results of pixel operations are described. FIG. 8A illustrates a structure of a pixel used for the simulation. The number of pixels is two (P1 and P2), and the circuit 110 has the structure (only the liquid crystal device) illustrated in FIG. 6B. Performed was the simulation of voltage changes of the node NA in each pixel (the node $NA_{11}$ and the node $NA_{12}$) in the operation of making the input voltage approximately three times higher. Note that SPICE was used as circuit simulation software.

Parameters used in the simulation are as follows: all of the transistor sizes are L/W=3 µm/30 µm, the capacitance value of a capacitor C1 is 10 pF, and the capacitance value of a liquid crystal device Clc is 2 pF. In addition, a voltage applied to a gate of a transistor is set to +15 V as "H" and −10 V as "L", and a common potential (VCOM) is set to 0 V.

Figure 8B:
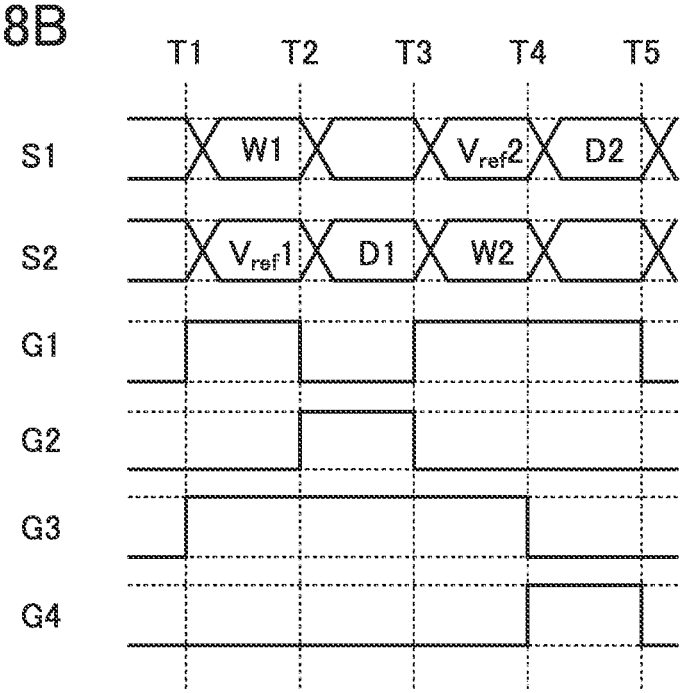
FIG. 8B is a timing chart showing the operation of a pixel circuit.

FIG. 8B is a timing chart used in the simulation. W1 is a weight for the pixel P1, D1 is data for the pixel P1, $V_{ref}1$ is a reference potential for the pixel P1, W2 is a weight for the pixel P2, D2 is data for the pixel P2, and $V_{ref}2$ is a reference potential for the pixel P2.

In the simulation, the examination of a positive polarity operation and the examination of a negative polarity operation were alternately performed. In the positive polarity operation, W1 and W2 were set to +5 V, D1 and D2 were set to +5 V, and $V_{ref}1$ and $V_{ref}2$ were set to −5 V. In the negative polarity operation, W1 and W2 were set to −5 V, D1 and D2 were set to −5 V, and $V_{ref}1$ and $V_{ref}2$ were set to +5 V.

Figure 9:
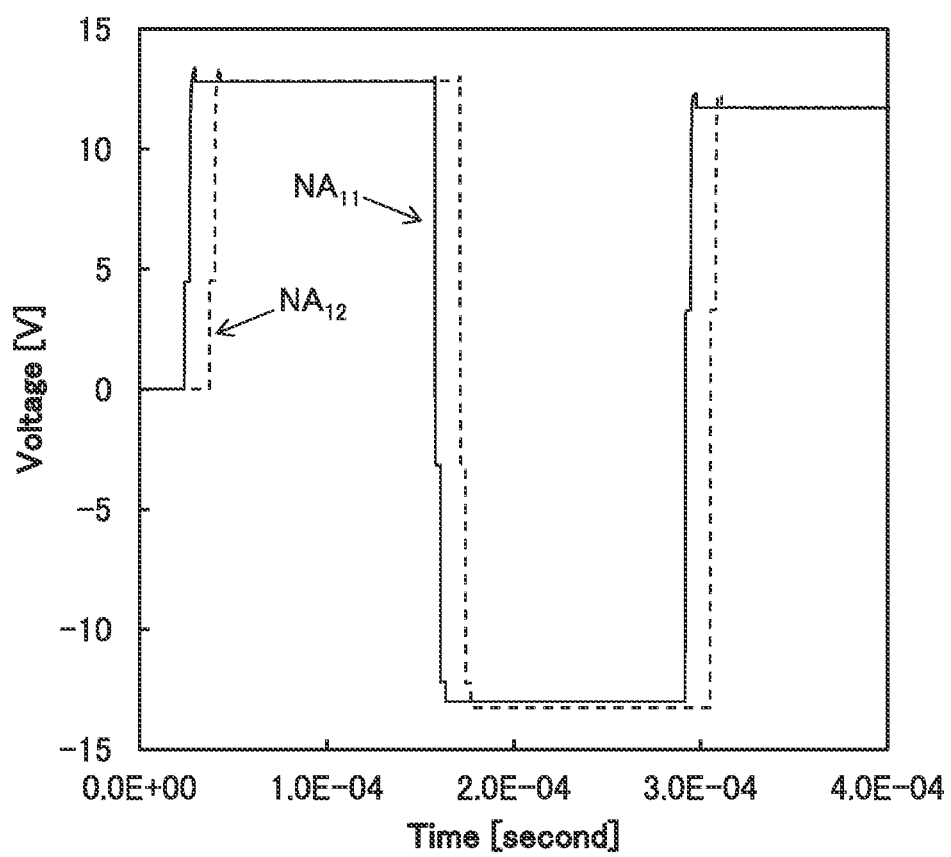
FIG. 9 is a diagram showing simulation results.

FIG. 9 shows the simulation results of the positive polarity operation and the negative polarity operation, and the horizontal axis represents time (second) and the vertical axis represents voltage (V) of the node NA (the node $NA_{11}$ and the node $NA_{12}$). Although a voltage three times higher than the input voltage is not obtained because of the capacitance ratio, a voltage higher than the input voltage can be generated in both the positive polarity operation and the negative polarity operation.

The above simulation results show the effect of one embodiment of the present invention.

This embodiment can be implemented in combination with any of the structures described in the other embodiments and the like, as appropriate.

Embodiment 2

In this embodiment, a structure example of a display apparatus using a liquid crystal device and a structure example of a display apparatus using a light-emitting device are described. Note that the description of the components, operations, and functions of the display apparatus described in Embodiment 1 is omitted in this embodiment.

The pixel described in Embodiment 1 can be used in the display apparatus described in this embodiment. Note that a scan line driver circuit and a signal line driver circuit which are described below correspond to the gate driver and the source driver, respectively.

Figure 10A:
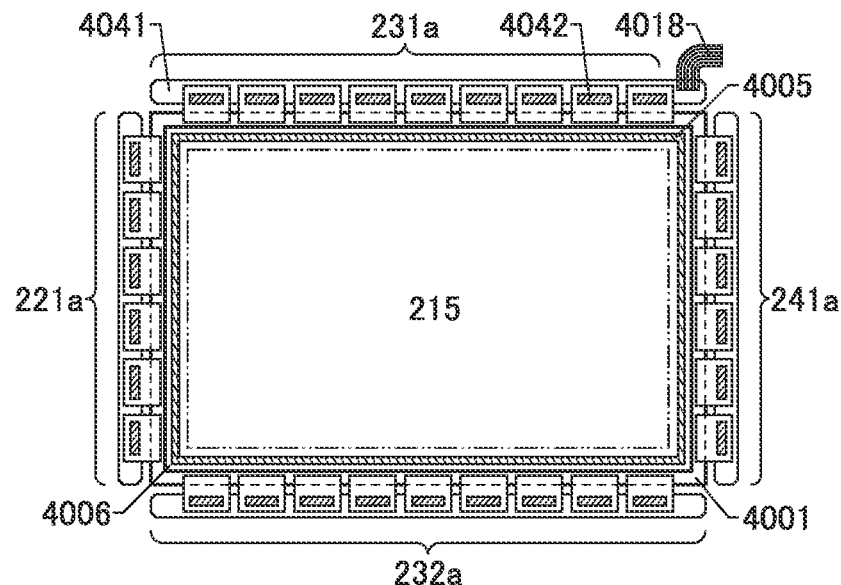
FIG. 10A to FIG. 10C are diagrams illustrating display apparatuses.
Figure 10B:
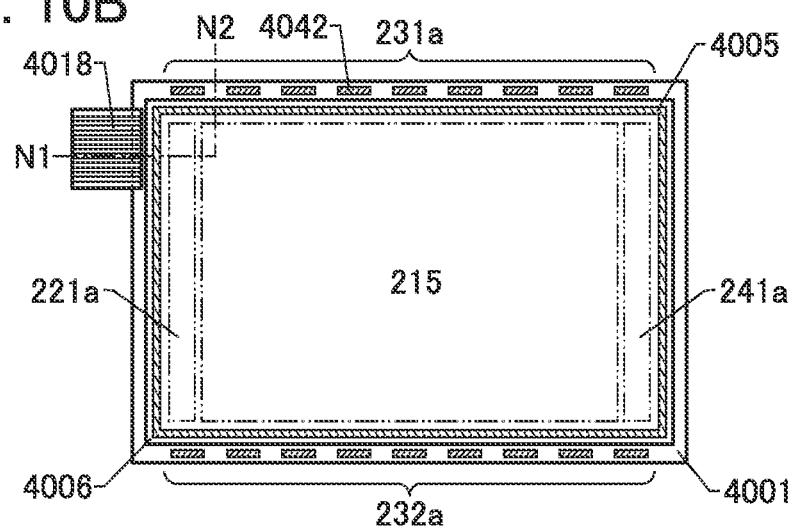
Figure 10C:
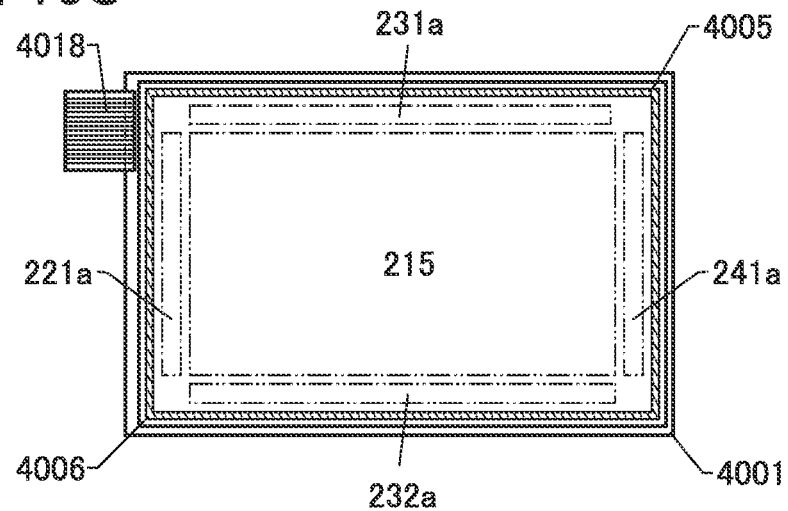

FIG. 10A to FIG. 10C are diagrams each illustrating a structure of a display apparatus in which one embodiment of the present invention can be used.

In FIG. 10A, a sealant 4005 is provided to surround a display portion 215 provided over a first substrate 4001, and the display portion 215 is sealed with the sealant 4005 and a second substrate 4006.

In FIG. 10A, a scan line driver circuit 221a, a signal line driver circuit 231a, a signal line driver circuit 232a, and a common line driver circuit 241a each include a plurality of integrated circuits 4042 provided over a printed circuit board 4041. The integrated circuits 4042 are each formed using a single crystal semiconductor or a polycrystalline semiconductor. The common line driver circuit 241a has a function of supplying a prescribed potential to the wirings 128, 129, 133, 134, and the like described in Embodiment 1.

Signals and potentials are supplied to the scan line driver circuit 221a, the common line driver circuit 241a, the signal line driver circuit 231a, and the signal line driver circuit 232a through an FPC (Flexible printed circuit) 4018.

The integrated circuits 4042 included in the scan line driver circuit 221a and the common line driver circuit 241a each have a function of supplying a selection signal to the display portion 215. The integrated circuits 4042 included in the signal line driver circuit 231a and the signal line driver circuit 232a each have a function of supplying image data to the display portion 215. The integrated circuits 4042 are mounted in a region different from the region surrounded by the sealant 4005 over the first substrate 4001.

Note that the connection method of the integrated circuits 4042 is not particularly limited; a wire bonding method, a COG (Chip On Glass) method, a TCP (Tape Carrier Package) method, a COF (Chip On Film) method, or the like can be used.

FIG. 10B illustrates an example in which the integrated circuits 4042 included in the signal line driver circuit 231a and the signal line driver circuit 232a are mounted by a COG method. Some or all of the driver circuits can be formed over the same substrate as the display portion 215, whereby a system-on-panel can be formed.

In the example illustrated in FIG. 10B, the scan line driver circuit 221a and the common line driver circuit 241a are formed over the same substrate as the display portion 215. When the driver circuits are formed concurrently with pixel circuits in the display portion 215, the number of components can be reduced. Accordingly, the productivity can be increased.

In FIG. 10B, the sealant 4005 is provided to surround the display portion 215, the scan line driver circuit 221a, and the common line driver circuit 241a provided over the first substrate 4001. The second substrate 4006 is provided over the display portion 215, the scan line driver circuit 221a, and the common line driver circuit 241a. Consequently, the display portion 215, the scan line driver circuit 221a, and the common line driver circuit 241a are sealed together with a display device with the use of the first substrate 4001, the sealant 4005, and the second substrate 4006.

Although the signal line driver circuit 231a and the signal line driver circuit 232a are separately formed and mounted on the first substrate 4001 in the example illustrated in FIG. 10B, one embodiment of the present invention is not limited to this structure. The scan line driver circuits may be separately formed and then mounted, part of the signal line driver circuits or part of the scan line driver circuits may be separately formed and then mounted. The signal line driver circuit 231a and the signal line driver circuit 232a may be formed over the same substrate as the display portion 215, as illustrated in FIG. 10C.

In some cases, the display apparatus encompasses a panel in which the display device is sealed, and a module in which an IC or the like including a controller is mounted on the panel.

The display portion and the scan line driver circuit provided over the first substrate each include a plurality of transistors. As the transistors, the OS transistor or the Si transistor described in Embodiment 1 can be used.

Transistors included in a peripheral driver circuit and transistors included in the pixel circuits of the display portion may have the same structure or different structures. The transistors included in the peripheral driver circuit may be transistors having the same structure, or transistors having two or more kinds of structures may be included. Similarly, the transistors included in the pixel circuits may be transistors having the same structure, or transistors having two or more kinds of structures may be included.

An input device 4200 can be provided over the second substrate 4006. The display apparatuses illustrated in FIG. 10A to FIG. 10C and provided with the input device 4200 can function as a touch panel.

There is no particular limitation on a sensor device (also referred to as a sensor element) included in the touch panel of one embodiment of the present invention. A variety of sensors capable of sensing an approach or a contact of a sensing target such as a finger or a stylus can be used as the sensor device.

For example, a variety of types such as a capacitive type, a resistive type, a surface acoustic wave type, an infrared type, an optical type, and a pressure-sensitive type can be used for the sensor.

In this embodiment, a touch panel including a capacitive sensor device is described as an example.

Examples of the capacitive sensor device include a surface capacitive sensor device and a projected capacitive sensor device. Examples of the projected capacitive sensor device include a self-capacitive sensor device and a mutual capacitive sensor device. The use of a mutual capacitive sensor device is preferred because multiple points can be sensed simultaneously.

The touch panel of one embodiment of the present invention can have any of a variety of structures, including a structure in which a display apparatus and a sensor device that are separately formed are attached to each other and a structure in which an electrode and the like included in a sensor device are provided on one or both of a substrate supporting a display device and a counter substrate.

Figure 11A:
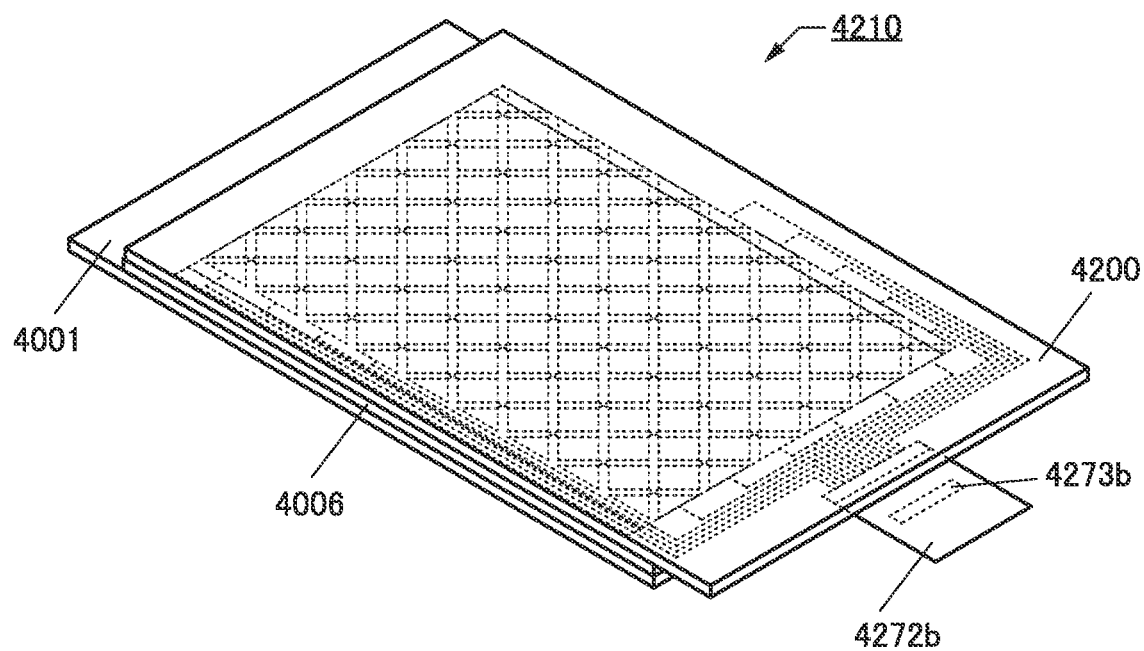
FIG. 11A and FIG. 11B are diagrams illustrating a touch panel.
Figure 11B:
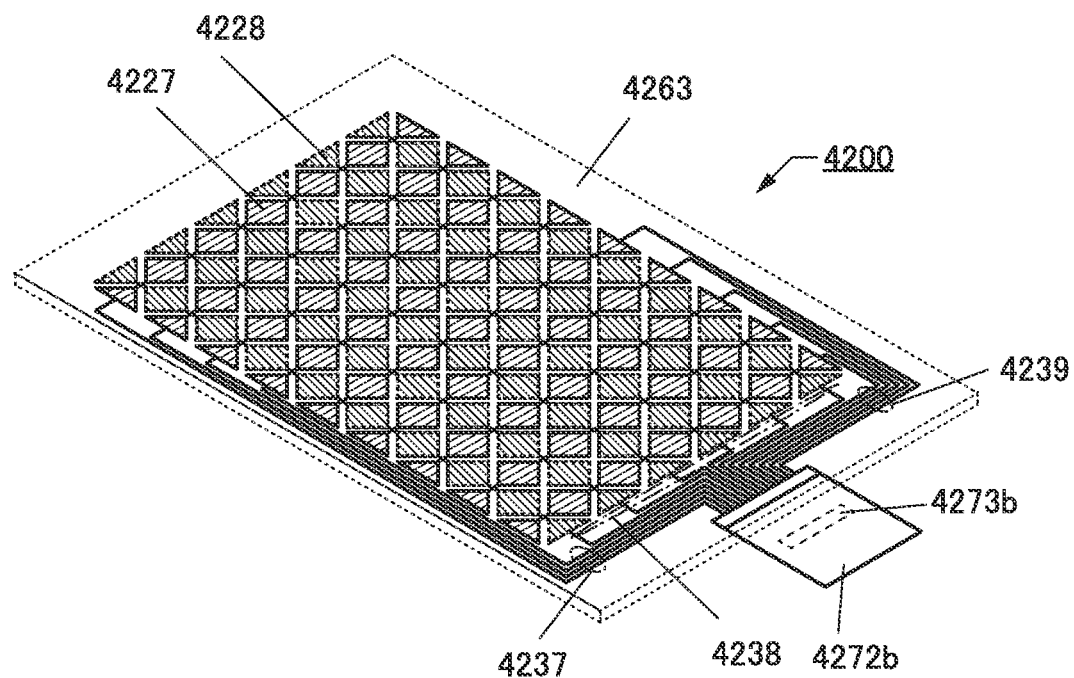

FIG. 11A and FIG. 11B illustrate an example of the touch panel. FIG. 11A is a perspective view of a touch panel 4210. FIG. 11B is a schematic perspective view of the input device 4200. Note that for clarity, only typical components are illustrated.

The touch panel 4210 has a structure in which a display apparatus and a sensor device that are separately formed are attached to each other.

The touch panel 4210 includes the input device 4200 and the display apparatus, which are provided to overlap with each other.

The input device 4200 includes a substrate 4263, an electrode 4227, an electrode 4228, a plurality of wirings 4237, a plurality of wirings 4238, and a plurality of wirings 4239. For example, the electrode 4227 can be electrically connected to any of the wirings 4237 or any of the wirings 4239. In addition, the electrode 4228 can be electrically connected to any of the wirings 4239. An FPC 4272b is electrically connected to each of the plurality of wirings 4237 and the plurality of wirings 4238. An IC 4273b can be provided for the FPC 4272b.

Alternatively, a touch sensor may be provided between the first substrate 4001 and the second substrate 4006 in the display apparatus. In the case where a touch sensor is provided between the first substrate 4001 and the second substrate 4006, either a capacitive touch sensor or an optical touch sensor including a photoelectric conversion element may be used.

FIG. 12A and FIG. 12B are cross-sectional views of a portion indicated by the chain line N1-N2 in FIG. 10B. Display apparatuses illustrated in FIG. 12A and FIG. 12B each include an electrode 4015, and the electrode 4015 is electrically connected to a terminal included in the FPC 4018 through an anisotropic conductive layer 4019. In FIG. 12A and FIG. 12B, the electrode 4015 is electrically connected to a wiring 4014 in an opening formed in an insulating layer 4112, an insulating layer 4111, and an insulating layer 4110.

The electrode 4015 is formed of the same conductive layer as a first electrode layer 4030, and the wiring 4014 is formed of the same conductive layer as source electrodes and drain electrodes of a transistor 4010 and a transistor 4011.

The display portion 215 and the scan line driver circuit 221a provided over the first substrate 4001 each include a plurality of transistors. In FIG. 12A and FIG. 12B, the transistor 4010 included in the display portion 215 and the transistor 4011 included in the scan line driver circuit 221a are illustrated as an example. Note that in the examples illustrated in FIG. 12A and FIG. 12B, the transistor 4010 and the transistor 4011 are bottom-gate transistors but may be top-gate transistors.

In FIG. 12A and FIG. 12B, the insulating layer 4112 is provided over the transistor 4010 and the transistor 4011. In FIG. 12B, a partition wall 4510 is formed over the insulating layer 4112.

The transistor 4010 and the transistor 4011 are provided over an insulating layer 4102. The transistor 4010 and the transistor 4011 each include an electrode 4017 formed over the insulating layer 4111. The electrode 4017 can function as a back gate electrode.

The display apparatuses illustrated in FIG. 12A and FIG. 12B each include a capacitor 4020. An example is illustrated in which the capacitor 4020 includes an electrode 4021 formed in the same step as a gate electrode of the transistor 4010, an insulating layer 4103, and an electrode formed in the same step as the source electrode and the drain electrode. The capacitor 4020 is not limited to having this structure and may be formed using another conductive layer and another insulating layer.

The transistor 4010 provided in the display portion 215 is electrically connected to the display device. FIG. 12A illustrates an example of a liquid crystal display apparatus using a liquid crystal device as the display device. In FIG. 12A, a liquid crystal device 4013 serving as the display device includes the first electrode layer 4030, a second electrode layer 4031, and a liquid crystal layer 4008. Note that an insulating layer 4032 and an insulating layer 4033 functioning as alignment films are provided so that the liquid crystal layer 4008 is positioned therebetween. The second electrode layer 4031 is provided on the second substrate 4006 side, and the first electrode layer 4030 and the second electrode layer 4031 overlap with each other with the liquid crystal layer 4008 therebetween.

A liquid crystal device having a variety of modes can be used as the liquid crystal device 4013. For example, a liquid crystal device using a VA (Vertical Alignment) mode, a TN (Twisted Nematic) mode, an IPS (In-Plane-Switching) mode, an ASM (Axially Symmetric aligned Micro-cell) mode, an OCB (Optically Compensated Bend) mode, an FLC (Ferroelectric Liquid Crystal) mode, an AFLC (Anti-Ferroelectric Liquid Crystal) mode, an ECB (Electrically Controlled Birefringence) mode, a VA-IPS mode, a guest-host mode, or the like can be used.

As the liquid crystal display apparatus described in this embodiment, a normally black liquid crystal display apparatus such as a transmissive liquid crystal display apparatus employing a vertical alignment (VA) mode may be used. As the vertical alignment mode, an MVA (Multi-Domain Vertical Alignment) mode, a PVA (Patterned Vertical Alignment) mode, an ASV (Advanced Super View) mode, and the like can be used.

Note that the liquid crystal device is an element that controls transmission and non-transmission of light by the optical modulation action of liquid crystal. The optical modulation action of the liquid crystal is controlled by an electric field applied to the liquid crystal (including a horizontal electric field, a vertical electric field, and an oblique electric field). As the liquid crystal used for the liquid crystal device, thermotropic liquid crystal, low-molecular liquid crystal, high-molecular liquid crystal, polymer dispersed liquid crystal (PDLC), ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Although an example of a liquid crystal display apparatus including a liquid crystal device with a vertical electric field mode is illustrated in FIG. 12A, one embodiment of the present invention can be applied to a liquid crystal display apparatus including a liquid crystal device with a horizontal electric field mode. In the case of employing a horizontal electric field mode, liquid crystal exhibiting a blue phase for which an alignment film is not used may be used. The blue phase is one of liquid crystal phases, which is generated just before a cholesteric phase changes into an isotropic phase while the temperature of cholesteric liquid crystal is increased. Since the blue phase appears only in a narrow temperature range, a liquid crystal composition in which a chiral material of 5 weight % or more is mixed is used for the liquid crystal layer 4008 in order to improve the temperature range. The liquid crystal composition that contains liquid crystal exhibiting a blue phase and a chiral material has a short response speed and exhibits optical isotropy. In addition, the liquid crystal composition containing liquid crystal exhibiting a blue phase and a chiral material does not need alignment treatment and has small viewing angle dependence. Since an alignment film does not need to be provided and rubbing treatment is unnecessary, electrostatic discharge damage caused by the rubbing treatment can be prevented and defects or damage of the liquid crystal display apparatus in the manufacturing process can be reduced.

A spacer 4035 is a columnar spacer obtained by selective etching of an insulating layer and is provided in order to control a distance (a cell gap) between the first electrode layer 4030 and the second electrode layer 4031. Note that a spherical spacer may alternatively be used.

A black matrix (a light-blocking layer); a coloring layer (a color filter); an optical member (an optical substrate) such as a polarizing member, a retardation member, or an anti-reflection member; or the like may be provided as appropriate if needed. For example, circular polarization may be employed by using a polarizing substrate and a retardation substrate. In addition, a backlight, a side light, or the like may be used as a light source. A micro LED or the like may be used as the backlight or the side light.

In the display apparatus illustrated in FIG. 12A, a light-blocking layer 4132, a coloring layer 4131, and an insulating layer 4133 are provided between the substrate 4006 and the second electrode layer 4031.

Examples of a material that can be used for the light-blocking layer include carbon black, titanium black, a metal, a metal oxide, and a composite oxide containing a solid solution of a plurality of metal oxides. The light-blocking layer may be a film containing a resin material or may be a thin film of an inorganic material such as a metal. Stacked films containing the material used for the coloring layer can also be used for the light-blocking layer. For example, a stacked-layer structure of a film containing a material of a coloring layer which transmits light of a certain color and a film containing a material of a coloring layer which transmits light of another color can be employed. It is preferable that the coloring layer and the light-blocking layer be formed using the same material because the same manufacturing apparatus can be used and the process can be simplified.

Examples of a material that can be used for the coloring layer include a metal material, a resin material, and a resin material containing a pigment or a dye. The light-blocking layer and the coloring layer can be formed by an inkjet method, for example.

The display apparatuses illustrated in FIG. 12A and FIG. 12B each include the insulating layer 4111 and an insulating layer 4104. As the insulating layer 4111 and the insulating layer 4104, insulating layers through which an impurity element does not easily pass are used. A semiconductor layer of the transistor is positioned between the insulating layer 4111 and the insulating layer 4104, whereby entry of impurities from the outside can be prevented.

A light-emitting device can be used as the display device included in the display apparatus. As the light-emitting device, for example, an EL device that utilizes electroluminescence can be used. An EL device includes a layer containing a light-emitting compound (also referred to as an "EL layer") between a pair of electrodes. By generating a potential difference between the pair of electrodes that is greater than the threshold voltage of the EL device, holes are injected to the EL layer from the anode side and electrons are injected to the EL layer from the cathode side. The injected electrons and holes are recombined in the EL layer and the light-emitting compound contained in the EL layer emits light.

As the EL device, an organic EL device or an inorganic EL device can be used, for example. Note that an LED (including a micro LED) that uses a compound semiconductor as a light-emitting material can also be used.

Note that in addition to the light-emitting compound, the EL layer may further include a substance with a high hole-injection property, a substance with a high hole-transport property, a hole-blocking material, a substance with a high electron-transport property, a substance with a high electron-injection property, a substance with a bipolar property (a substance with a high electron- and hole-transport property), or the like.

The EL layer can be formed by a method such as an evaporation method (including a vacuum evaporation method), a transfer method, a printing method, an inkjet method, or a coating method.

The inorganic EL devices are classified according to their element structures into a dispersion-type inorganic EL device and a thin-film inorganic EL device. A dispersion-type inorganic EL device includes a light-emitting layer where particles of a light-emitting material are dispersed in a binder, and its light emission mechanism is donor-acceptor recombination type light emission that utilizes a donor level and an acceptor level. A thin-film inorganic EL device has a structure where a light-emitting layer is positioned between dielectric layers, which are further positioned between electrodes, and its light emission mechanism is localization type light emission that utilizes inner-shell electron transition of metal ions. Note that the description is made here using an organic EL device as the light-emitting device.

In order to extract light emitted from the light-emitting device, at least one of the pair of electrodes needs to be transparent. A transistor and a light-emitting device are formed over a substrate. The light-emitting device can have a top emission structure in which light emission is extracted from the surface on the side opposite to the substrate; a bottom emission structure in which light emission is extracted from the surface on the substrate side; or a dual emission structure in which light emission is extracted from both surfaces. The light-emitting device having any of the emission structures can be used.

FIG. 12B illustrates an example of a light-emitting display apparatus using a light-emitting device as a display device (also referred to as an "EL display apparatus"). A light-emitting device 4513 serving as the display device is electrically connected to the transistor 4010 provided in the display portion 215. Note that the structure of the light-emitting device 4513 is a stacked-layer structure of the first electrode layer 4030, a light-emitting layer 4511, and the second electrode layer 4031; however, this embodiment is not limited to this structure. The structure of the light-emitting device 4513 can be changed as appropriate depending on the direction in which light is extracted from the light-emitting device 4513, or the like.

The partition wall 4510 is formed using an organic insulating material or an inorganic insulating material. It is particularly preferable that the partition wall 4510 be formed using a photosensitive resin material to have an opening portion over the first electrode layer 4030 such that a side surface of the opening portion slopes with continuous curvature.

The light-emitting layer 4511 may be formed using a single layer or a plurality of layers stacked.

The emission color of the light-emitting device 4513 can be white, red, green, blue, cyan, magenta, yellow, or the like depending on the material for the light-emitting layer 4511.

As a color display method, there are a method in which the light-emitting device 4513 that emits white light is combined with a coloring layer and a method in which the light-emitting device 4513 that emits light of a different emission color is provided in each pixel. The former method is more productive than the latter method. The latter method, which requires separate formation of the light-emitting layer 4511 pixel by pixel, is less productive than the former method. However, the latter method can provide higher color purity of the emission color than the former method. In the latter method, the color purity can be further increased when the light-emitting device 4513 has a microcavity structure.

Note that the light-emitting layer 4511 may contain an inorganic compound such as quantum dots. For example, when used for the light-emitting layer, the quantum dots can function as a light-emitting material.

A protective layer may be formed over the second electrode layer 4031 and the partition wall 4510 in order to prevent entry of oxygen, hydrogen, moisture, carbon dioxide, or the like into the light-emitting device 4513. For the protective layer, silicon nitride, silicon nitride oxide, aluminum oxide, aluminum nitride, aluminum oxynitride, aluminum nitride oxide, DLC (Diamond Like Carbon), or the like can be used. In a space enclosed by the first substrate 4001, the second substrate 4006, and the sealant 4005, a filler 4514 is provided for sealing. In this manner, it is preferable that packaging (sealing) be performed with a protective film (such as a laminate film or an ultraviolet curable resin film) or a cover material with high air-tightness and little degasification to prevent exposure to the outside air.

As the filler 4514, an ultraviolet curable resin or a thermosetting resin as well as an inert gas such as nitrogen or argon can be used; PVC (polyvinyl chloride), an acrylic resin, polyimide, an epoxy-based resin, a silicone-based resin, PVB (polyvinyl butyral), EVA (ethylene vinyl acetate), or the like can be used. A drying agent may be contained in the filler 4514.

A glass material such as a glass frit or a resin material such as a curable resin that is curable at room temperature, such as a two-component-mixture-type resin, a photocurable resin, or a thermosetting resin can be used for the sealant 4005. A drying agent may be contained in the sealant 4005.

If necessary, an optical film such as a polarizing plate, a circularly polarizing plate (including an elliptically polarizing plate), a retardation plate (a quarter-wave plate or a half-wave plate), or a color filter may be provided as appropriate on an emission surface of the light-emitting device. Furthermore, the polarizing plate or the circularly polarizing plate may be provided with an anti-reflection film. For example, anti-glare treatment by which reflected light can be diffused by projections and depressions on a surface so as to reduce the glare can be performed.

When the light-emitting device has a microcavity structure, light with high color purity can be extracted. Furthermore, when a microcavity structure and a color filter are used in combination, the glare can be reduced and visibility of a displayed image can be increased.

The first electrode layer and the second electrode layer (also called a pixel electrode layer, a common electrode layer, a counter electrode layer, or the like) for applying voltage to the display device each have a light-transmitting property or a light-reflecting property, which depends on the direction in which light is extracted, the position where the electrode layer is provided, and the pattern structure of the electrode layer.

Each of the first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

Each of the first electrode layer 4030 and the second electrode layer 4031 can also be formed using one or more kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a metal nitride thereof.

A conductive composition containing a conductive high molecule (also referred to as conductive polymer) can be used for the first electrode layer 4030 and the second electrode layer 4031. As the conductive high molecule, what is called a π-electron conjugated conductive high molecule can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Since the transistor is easily broken by static electricity or the like, a protective circuit for protecting the driver circuit is preferably provided. The protective circuit is preferably formed using a nonlinear element.

Figure 13:
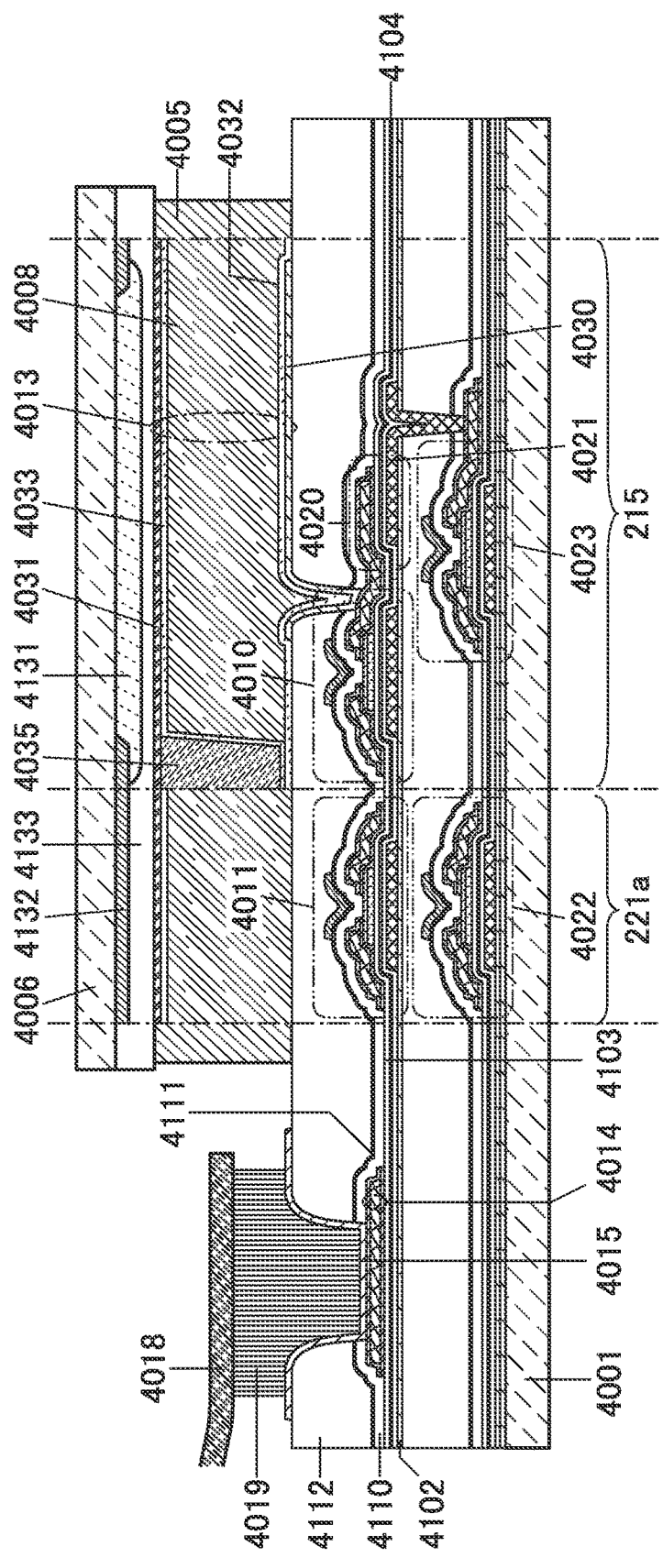
FIG. 13 is a diagram illustrating a display apparatus.

Note that as illustrated in FIG. 13, a stacked structure including a region where a transistor and a capacitor overlap with each other in the height direction may be employed. For example, when the transistor 4011 and a transistor 4022 included in the driver circuit are provided to overlap with each other, a display apparatus with a narrow frame can be provided. Furthermore, when the transistor 4010, a transistor 4023, the capacitor 4020, and the like included in the pixel circuit are provided to at least partly overlap with each other, the aperture ratio and the resolution can be improved. Although an example in which the stacked structure is employed for the liquid crystal display apparatus illustrated in FIG. 12A is illustrated in FIG. 13, the stacked structure may be employed for the EL display apparatus illustrated in FIG. 12B.

In addition, a conductive film with a high visible-light-transmitting property is used as an electrode or a wiring in the pixel circuit, whereby transmittance of light in the pixel can be increased and the aperture ratio can be substantially improved. Note that in the case where an OS transistor is used, a semiconductor layer also has a light-transmitting property and thus the aperture ratio can be further increased. These are effective even when transistors and the like are not stacked.

The display apparatus may have a structure with a combination of a liquid crystal display apparatus and a light-emitting apparatus.

The light-emitting apparatus is disposed on the side opposite to the display surface or on an end portion of the display surface. The light-emitting apparatus has a function of supplying light to the display device. The light-emitting apparatus can also be referred to as a backlight.

Here, the light-emitting apparatus can include a plate-like or sheet-like light guide portion (also referred to as a light guide plate) and a plurality of light-emitting devices which emit light of different colors. When the light-emitting devices are disposed in the vicinity of the side surface of the light guide portion, light can be emitted from the side surface of the light guide portion to the inside. The light guide portion has a mechanism that changes an optical path (also referred to as a light extraction mechanism), and this enables the light-emitting apparatus to emit light uniformly to a pixel portion of a display panel. Alternatively, the light-emitting apparatus may be provided directly under the pixel without providing the light guide portion.

The light-emitting apparatus preferably includes light-emitting devices of three colors, red (R), green (G), and blue (B). In addition, a light-emitting device of white (W) may be included. A light emitting diode (LED) is preferably used as these light-emitting devices.

Furthermore, the light-emitting devices preferably have extremely high color purities; the full width at half maximum (FWHM) of the emission spectrum of the light-emitting device is less than or equal to 50 nm, preferably less than or equal to 40 nm, further preferably less than or equal to 30 nm, still further preferably less than or equal to 20 nm. Note that the full width at half maximum of the emission spectrum is preferably as small as possible, and can be, for example, greater than or equal to 1 nm. Thus, when a color image is displayed, a vivid image with high color reproducibility can be displayed.

As the red light-emitting device, an element whose wavelength of an emission spectrum peak is in a range from 625 nm to 650 nm is preferably used. As the green light-emitting device, an element whose wavelength of an emission spectrum peak is in a range from 515 nm to 540 nm is preferably used. As the blue light-emitting device, an element whose wavelength of an emission spectrum peak is in a range from 445 nm to 470 nm is preferably used.

The display apparatus can make the light-emitting devices of the three colors blink sequentially, drive the pixels in synchronization with these light-emitting devices, and display a color image on the basis of the successive additive color mixing method. This driving method can also be referred to as a field-sequential driving.

By the field-sequential driving, a clear color image can be displayed. In addition, a smooth moving image can be displayed. When the above-described driving method is used, one pixel does not need to be formed with subpixels of different colors, which can make an effective reflection area (also referred to as an effective display area or an aperture ratio) per pixel large; thus, a bright image can be displayed. Furthermore, the pixels do not need to be provided with color filters, and thus can have improved transmittance and achieve brighter image display. In addition, the manufacturing process can be simplified, and the manufacturing costs can be reduced.

FIG. 14A and FIG. 14B each illustrate an example of a schematic cross-sectional view of a display apparatus capable of the field-sequential driving. A backlight unit capable of emitting light of RGB colors is provided on the first substrate 4001 side of the display apparatus. Note that in the field-sequential driving, the RGB colors are expressed through time division light emission, and thus color filters are not needed.

A backlight unit 4340a illustrated in FIG. 14A has a structure in which a plurality of light-emitting devices 4342 are provided directly under a pixel with a diffusing plate 4352 positioned therebetween. The diffusing plate 4352 has functions of diffusing light emitted from the light-emitting device 4342 to the first substrate 4001 side and making the luminance in a display portion uniform. Between the light-emitting device 4342 and the diffusing plate 4352, a polarizing plate may be provided if necessary. The diffusing plate 4352 does not need to be provided if not needed. The light-blocking layer 4132 may be omitted.

The backlight unit 4340a can include a large number of light-emitting devices 4342, which enables bright image display. Moreover, there are advantages that a light guide plate is not needed and light efficiency of the light-emitting device 4342 is less likely to be lowered. Note that the light-emitting device 4342 may be provided with a light diffusion lens 4344 if necessary.

A backlight unit 4340b illustrated in FIG. 14B has a structure in which a light guide plate 4341 is provided directly under a pixel with the diffusing plate 4352 positioned therebetween. The plurality of light-emitting devices 4342 are provided at an end portion of the light guide plate 4341. The light guide plate 4341 has an uneven shape on the side opposite to the diffusing plate 4352, and can scatter wave-guided light with the uneven shape to emit the light in the direction of the diffusing plate 4352.

The light-emitting device 4342 can be fixed to a printed circuit board 4347. Note that in FIG. 14B, the light-emitting devices 4342 of RGB colors overlap with each other; however, the light-emitting devices 4342 of RGB colors can be arranged to be lined up in the depth direction. A reflective layer 4348 that reflects visible light may be provided on the side surface of the light guide plate 4341 which is opposite to the light-emitting device 4342.

The backlight unit 4340b can reduce the number of light-emitting devices 4342, leading to reductions in cost and thickness.

A light-scattering liquid crystal device may be used as the liquid crystal device. The light-scattering liquid crystal device is preferably an element containing a composite material of liquid crystal and a polymer molecule. For example, a polymer dispersed liquid crystal device can be used. Alternatively, a polymer network liquid crystal (PNLC) element may be used.

The light-scattering liquid crystal device has a structure in which a liquid crystal portion is provided in a three-dimensional network structure of a resin portion sandwiched between a pair of electrodes. As a material used in the liquid crystal portion, for example, a nematic liquid crystal can be used. A photocurable resin can be used for the resin portion. The photocurable resin can be a monofunctional monomer such as acrylate or methacrylate; a polyfunctional monomer such as diacrylate, triacrylate, dimethacrylate, or trimethacrylate; or a polymerizable compound obtained by mixing these.

The light-scattering liquid crystal device displays an image by transmitting or scattering light utilizing the anisotropy of a refractive index of a liquid crystal material. The resin portion may have the anisotropy of a refractive index. When liquid crystal molecules are arranged in a certain direction in accordance with a voltage applied to the light-scattering liquid crystal device, a direction is generated at which a difference in a refractive index between the liquid crystal portion and the resin portion is small. Incident light along the direction passes without being scattered in the liquid crystal portion. Thus, the light-scattering liquid crystal device is perceived in a transparent state from the direction. By contrast, when liquid crystal molecules are arranged randomly in accordance with the applied voltage, a large difference in a refractive index between the liquid crystal portion and the resin portion is not generated, and incident light is scattered in the liquid crystal portion. Thus, the light-scattering liquid crystal device is in an opaque state regardless of the viewing direction.

FIG. 15A illustrates a structure in which the liquid crystal device 4013 of the display apparatus in FIG. 14A is replaced by a light-scattering liquid crystal device 4016. The light-scattering liquid crystal device 4016 includes a composite layer 4009 including a liquid crystal portion and a resin portion, and the electrode layers 4030 and 4031. Although components relating to the field-sequential driving are the same as those in FIG. 14A, when the light-scattering liquid crystal device 4016 is used, an alignment film and a polarizing plate are not necessary. Note that the spherical spacer 4035 is illustrated, but the spacer 4035 may have a columnar shape.

FIG. 15B illustrates a structure in which the liquid crystal device 4013 of the display apparatus in FIG. 14B is replaced by the light-scattering liquid crystal device 4016. In the structure of FIG. 14B, it is preferable that light be transmitted when a voltage is not applied to the light-scattering liquid crystal device 4016, and light be scattered when a voltage is applied. With such a structure, the display apparatus can be transparent in a normal state (state in which no image is displayed). In that case, a color image can be displayed when a light scattering operation is performed.

FIG. 16A to FIG. 16E illustrate modification examples of the display apparatus illustrated in FIG. 15B. Note that in FIG. 16A to FIG. 16E, some components in FIG. 15B are used and the other components are not illustrated for simplicity.

Figure 16A:
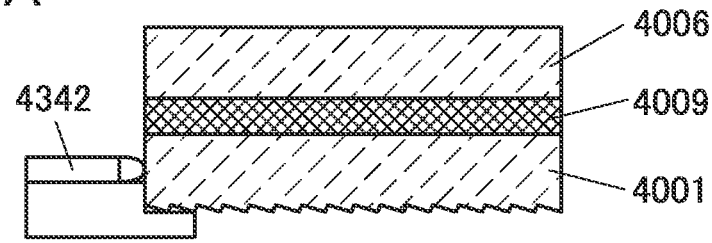
FIG. 16A to FIG. 16E are diagrams illustrating display apparatuses.

FIG. 16A illustrates a structure in which the substrate 4001 has a function of a light guide plate. An outer surface of the substrate 4001 may have an uneven shape. With this structure, a light guide plate does not need to be provided additionally, leading to a reduction in a manufacturing cost. Furthermore, the attenuation of light caused by the light guide plate also does not occur; accordingly, light emitted from the light-emitting device 4342 can be efficiently utilized.

Figure 16B:
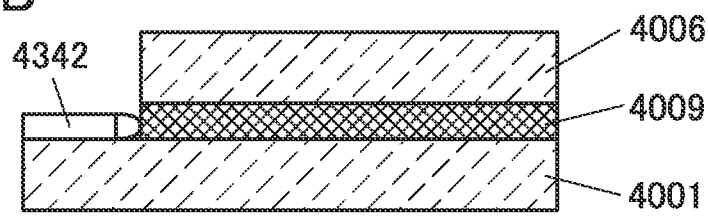

FIG. 16B illustrates a structure in which light enters from the vicinity of an end portion of the composite layer 4009. By utilizing total reflection at the interface between the composite layer 4009 and the substrate 4006 and the interface between the composite layer 4009 and the substrate 4001, light can be emitted to the outside from the light-scattering liquid crystal device. For the resin portion of the composite layer 4009, a material having a refractive index higher than that of the substrate 4001 and that of the substrate 4006 is used.

Figure 16C:
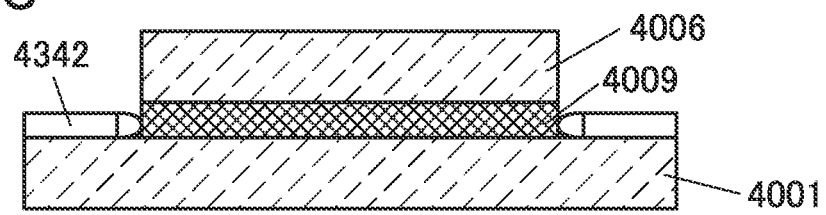

Note that the light-emitting device 4342 may be provided on one side of the display apparatus, or may be provided on each of two sides facing each other as illustrated in FIG. 16C. Furthermore, the light-emitting devices 4342 may be provided on three sides or four sides. When the light-emitting devices 4342 are provided on a plurality of sides, attenuation of light can be compensated for and application to a large-area display device is possible.

Figure 16D:
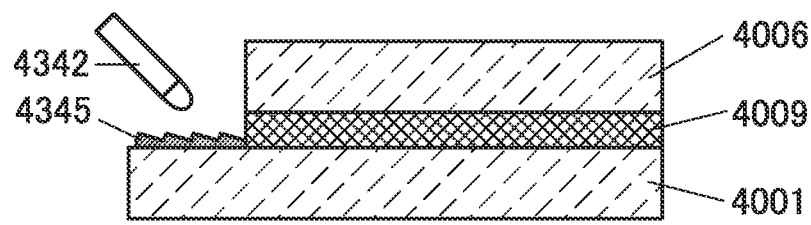

FIG. 16D illustrates a structure in which light emitted from the light-emitting device 4342 is guided to the display apparatus through a mirror 4345. With this structure, light can be guided easily with a certain angle to the display apparatus; thus, total reflection light can be obtained efficiently.

Figure 16E:
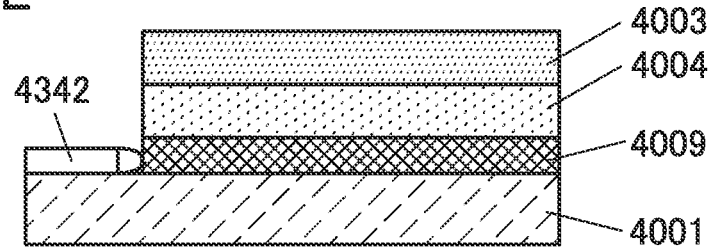

FIG. 16E illustrates a structure in which a layer 4003 and a layer 4004 are stacked over the composite layer 4009. One of the layer 4003 and the layer 4004 is a support such as a glass substrate, and the other can be formed of an inorganic film, a coating film of an organic resin, a film, or the like. For the resin portion of the composite layer 4009, a material having a refractive index higher than that of the layer 4004 is used. For the layer 4004, a material having a refractive index higher than that of the layer 4003 is used.

A first interface is formed between the composite layer 4009 and the layer 4004, and a second interface is formed between the layer 4004 and the layer 4003. With this structure, light passing through the first interface without being totally reflected is totally reflected at the second interface and can be returned to the composite layer 4009. Accordingly, light emitted from the light-emitting device 4342 can be efficiently utilized.

Note that the structures in FIG. 15B and FIG. 16A to FIG. 16E can be combined with each other.

This embodiment can be implemented in combination with any of the structures described in the other embodiments and the like, as appropriate.

Embodiment 3

In this embodiment, examples of transistors which can be used as the transistors described in the above embodiments are described with reference to drawings.

The display apparatus of one embodiment of the present invention can be fabricated using a transistor with any of various structures, such as a bottom-gate transistor or a top-gate transistor. Therefore, a material of a semiconductor layer or the structure of a transistor can be easily changed depending on the existing production line.

Bottom-Gate Transistor

FIG. 17A1 is a cross-sectional view of a channel-protective transistor 810, which is a type of bottom-gate transistor, in the channel length direction. In FIG. 17A1, the transistor 810 is formed over a substrate 771. The transistor 810 includes an electrode 746 over the substrate 771 with an insulating layer 772 therebetween. The transistor 810 also includes a semiconductor layer 742 over the electrode 746 with an insulating layer 726 therebetween. The electrode 746 can function as a gate electrode. The insulating layer 726 can function as a gate insulating layer.

Furthermore, an insulating layer 741 is provided over a channel formation region in the semiconductor layer 742. Furthermore, an electrode 744a and an electrode 744b are provided over the insulating layer 726 to be partly in contact with the semiconductor layer 742. The electrode 744a can function as one of a source electrode and a drain electrode. The electrode 744b can function as the other of the source electrode and the drain electrode. Part of the electrode 744a and part of the electrode 744b are formed over the insulating layer 741.

The insulating layer 741 can function as a channel protective layer. With the insulating layer 741 provided over the channel formation region, the semiconductor layer 742 can be prevented from being exposed at the time of forming the electrode 744a and the electrode 744b. Thus, the channel formation region in the semiconductor layer 742 can be prevented from being etched at the time of forming the electrode 744a and the electrode 744b. According to one embodiment of the present invention, a transistor with favorable electrical characteristics can be provided.

The transistor 810 includes an insulating layer 728 over the electrode 744a, the electrode 744b, and the insulating layer 741 and also includes an insulating layer 729 over the insulating layer 728.

In the case where an oxide semiconductor is used for the semiconductor layer 742, a material capable of removing oxygen from part of the semiconductor layer 742 to generate oxygen vacancies is preferably used at least for portions of the electrode 744a and the electrode 744b which are in contact with the semiconductor layer 742. The carrier concentration in the regions of the semiconductor layer 742 where oxygen vacancies are generated is increased, so that the regions become n-type regions ($n^+$ regions). Accordingly, the regions can function as a source region and a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 makes it possible to reduce contact resistance between the semiconductor layer 742 and each of the electrode 744a and the electrode 744b. Accordingly, the electrical characteristics of the transistor, such as the field-effect mobility and the threshold voltage, can be improved.

In the case where a semiconductor such as silicon is used for the semiconductor layer 742, a layer that functions as an n-type semiconductor or a p-type semiconductor is preferably provided between the semiconductor layer 742 and the electrode 744a and between the semiconductor layer 742 and the electrode 744b. The layer that functions as an n-type semiconductor or a p-type semiconductor can function as the source region or the drain region in the transistor.

The insulating layer 729 is preferably formed using a material that has a function of preventing or reducing diffusion of impurities into the transistor from the outside. Note that the insulating layer 729 can be omitted as necessary.

A transistor 811 illustrated in FIG. 17A2 is different from the transistor 810 in that an electrode 723 that can function as a back gate electrode is provided over the insulating layer 729. The electrode 723 can be formed using a material and a method similar to those for the electrode 746.

In general, a back gate electrode is formed using a conductive layer and positioned so that a channel formation region in a semiconductor layer is positioned between the gate electrode and the back gate electrode. Thus, the back gate electrode can function in a manner similar to that of the gate electrode. The potential of the back gate electrode may be the same as the potential of the gate electrode or may be a ground potential (GND potential) or a given potential. When the potential of the back gate electrode is changed independently of the potential of the gate electrode, the threshold voltage of the transistor can be changed.

The electrode 746 and the electrode 723 can each function as a gate electrode. Thus, the insulating layer 726, the insulating layer 728, and the insulating layer 729 can each function as a gate insulating layer. Note that the electrode 723 may be provided between the insulating layer 728 and the insulating layer 729.

Note that in the case where one of the electrode 746 and the electrode 723 is referred to as a "gate electrode", the other is referred to as a "back gate electrode". For example, in the transistor 811, in the case where the electrode 723 is referred to as a "gate electrode", the electrode 746 is referred to as a "back gate electrode". In the case where the electrode 723 is used as a "gate electrode", the transistor 811 can be regarded as a kind of top-gate transistor. One of the electrode 746 and the electrode 723 may be referred to as a "first gate electrode", and the other may be referred to as a "second gate electrode".

By providing the electrode 746 and the electrode 723 with the semiconductor layer 742 therebetween and setting the potential of the electrode 746 equal to the potential of the electrode 723, a region of the semiconductor layer 742 through which carriers flow is enlarged in the film thickness direction; thus, the number of transferred carriers is increased. As a result, the on-state current of the transistor 811 is increased and the field-effect mobility is increased.

Therefore, the transistor 811 is a transistor having a high on-state current for its occupation area. That is, the occupation area of the transistor 811 can be small for required on-state current. According to one embodiment of the present invention, the occupation area of a transistor can be reduced. Therefore, according to one embodiment of the present invention, a semiconductor device having a high degree of integration can be provided.

The gate electrode and the back gate electrode are formed using conductive layers and thus each have a function of preventing an electric field generated outside the transistor from affecting the semiconductor layer in which the channel is formed (in particular, an electric field blocking function against static electricity and the like). Note that when the back gate electrode is formed larger than the semiconductor layer such that the semiconductor layer is covered with the back gate electrode, the electric field blocking function can be enhanced.

When the back gate electrode is formed using a light-blocking conductive film, light can be prevented from entering the semiconductor layer from the back gate electrode side. Therefore, photodegradation of the semiconductor layer can be prevented, and deterioration in electrical characteristics of the transistor, such as a shift of the threshold voltage, can be prevented.

According to one embodiment of the present invention, a transistor with favorable reliability can be provided. Moreover, a semiconductor device with favorable reliability can be provided.

FIG. 17B1 is a cross-sectional view of a channel-protective transistor 820, which has a structure different from FIG. 17A1, in the channel length direction. The transistor 820 has substantially the same structure as the transistor 810 but is different from the transistor 810 in that the insulating layer 741 covers end portions of the semiconductor layer 742. The semiconductor layer 742 is electrically connected to the electrode 744a through an opening portion formed by selectively removing part of the insulating layer 741 that overlaps with the semiconductor layer 742. The semiconductor layer 742 is electrically connected to the electrode 744b through another opening portion formed by selectively removing part of the insulating layer 741 that overlaps with the semiconductor layer 742. A region of the insulating layer 741 that overlaps with the channel formation region can function as a channel protective layer.

A transistor 821 illustrated in FIG. 17B2 is different from the transistor 820 in that the electrode 723 that can function as a back gate electrode is provided over the insulating layer 729.

With the insulating layer 741, the semiconductor layer 742 can be prevented from being exposed at the time of forming the electrode 744a and the electrode 744b. Thus, the semiconductor layer 742 can be prevented from being reduced in thickness at the time of forming the electrode 744a and the electrode 744b.

The distance between the electrode 744a and the electrode 746 and the distance between the electrode 744b and the electrode 746 are longer in the transistor 820 and the transistor 821 than in the transistor 810 and the transistor 811. Thus, the parasitic capacitance generated between the electrode 744a and the electrode 746 can be reduced. Moreover, the parasitic capacitance generated between the electrode 744b and the electrode 746 can be reduced. According to one embodiment of the present invention, a transistor with favorable electrical characteristics can be provided.

FIG. 17C1 is a cross-sectional view of a channel-etched transistor 825, which is a type of bottom-gate transistor, in the channel length direction. In the transistor 825, the electrode 744a and the electrode 744b are formed without the insulating layer 729. Thus, part of the semiconductor layer 742 that is exposed at the time of forming the electrode 744a and the electrode 744b might be etched. However, since the insulating layer 729 is not provided, the productivity of the transistor can be increased.

A transistor 826 illustrated in FIG. 17C2 is different from the transistor 820 in that the electrode 723 that can function as a back gate electrode is provided over the insulating layer 729.

FIG. 18A1 to FIG. 18C2 are cross-sectional views of the transistors 810, 811, 820, 821, 825, and 826 in the channel width direction, respectively.

In each of the structures illustrated in FIG. 18B2 and FIG. 18C2, the gate electrode is connected to the back gate electrode, and the gate electrode and the back gate electrode have the same potential. In addition, the semiconductor layer 742 is positioned between the gate electrode and the back gate electrode.

The length of each of the gate electrode and the back gate electrode in the channel width direction is longer than the length of the semiconductor layer 742 in the channel width direction. In the channel width direction, the whole of the semiconductor layer 742 is covered with the gate electrode and the back gate electrode with the insulating layers 726, 741, 728, and 729 positioned therebetween.

In this structure, the semiconductor layer 742 included in the transistor can be electrically surrounded by electric fields of the gate electrode and the back gate electrode.

The transistor device structure in which the semiconductor layer 742 in which the channel formation region is formed is electrically surrounded by electric fields of the gate electrode and the back gate electrode, as in the transistor 821 and the transistor 826, can be referred to as a Surrounded channel (S-channel) structure.

With the S-channel structure, an electric field for inducing a channel can be effectively applied to the semiconductor layer 742 by one or both of the gate electrode and the back gate electrode, which improves the current drive capability of the transistor and offers high on-state current characteristics. In addition, the transistor can be miniaturized because the on-state current can be increased. The S-channel structure can also increase the mechanical strength of the transistor.

Top-Gate Transistor

A transistor 842 illustrated in FIG. 19A1 is a type of top-gate transistor. The electrode 744a and the electrode 744b are electrically connected to the semiconductor layer 742 through opening portions formed in the insulating layer 728 and the insulating layer 729.

Part of the insulating layer 726 that does not overlap with the electrode 746 is removed, and an impurity is introduced into the semiconductor layer 742 using the electrode 746 and the remaining insulating layer 726 as masks, so that an impurity region can be formed in the semiconductor layer 742 in a self-aligned manner. The transistor 842 includes a region where the insulating layer 726 extends beyond end portions of the electrode 746. The semiconductor layer 742 in a region into which the impurity is introduced through the insulating layer 726 has a lower impurity concentration than the semiconductor layer 742 in a region into which the impurity is introduced not through the insulating layer 726. Thus, an LDD (Lightly Doped Drain) region is formed in a region of the semiconductor layer 742 that overlaps with the insulating layer 726 but does not overlap with the electrode 746.

A transistor 843 illustrated in FIG. 19A2 is different from the transistor 842 in that the electrode 723 is included. The transistor 843 includes the electrode 723 that is formed over the substrate 771. The electrode 723 includes a region overlapping with the semiconductor layer 742 with the insulating layer 772 therebetween. The electrode 723 can function as a back gate electrode.

As in a transistor 844 illustrated in FIG. 19B1 and a transistor 845 illustrated in FIG. 19B2, the insulating layer 726 in a region that does not overlap with the electrode 746 may be completely removed. Alternatively, as in a transistor 846 illustrated in FIG. 19C1 and a transistor 847 illustrated in FIG. 19C2, the insulating layer 726 may be left.

Also in the transistor 842 to the transistor 847, after the formation of the electrode 746, an impurity is introduced into the semiconductor layer 742 using the electrode 746 as a mask, so that an impurity region can be formed in the semiconductor layer 742 in a self-aligned manner. According to one embodiment of the present invention, a transistor with favorable electrical characteristics can be provided. Furthermore, according to one embodiment of the present invention, a semiconductor device having a high degree of integration can be provided.

FIG. 20A1 to FIG. 20C2 are cross-sectional views of the transistors 842, 843, 844, 845, 846, and 847 in the channel width direction, respectively.

The transistor 843, the transistor 845, and the transistor 847 each have the above-described S-channel structure. However, one embodiment of the present invention is not limited to this, and the transistor 843, the transistor 845, and the transistor 847 do not necessarily have the S-channel structure.

This embodiment can be implemented in combination with any of the structures described in the other embodiments and the like, as appropriate.

Embodiment 4

Examples of an electronic device that can use the display apparatus of one embodiment of the present invention include display devices, personal computers, image storage devices or image reproducing devices provided with storage media, cellular phones, game machines including portable game machines, portable data terminals, e-book readers, cameras such as video cameras and digital still cameras, goggle-type displays (head-mounted displays), navigation systems, audio reproducing devices (e.g., car audio players and digital audio players), copiers, facsimiles, printers, multifunction printers, automated teller machines (ATM), and vending machines. FIG. 21A to FIG. 21F illustrate specific examples of such electronic devices.

Figure 21A:
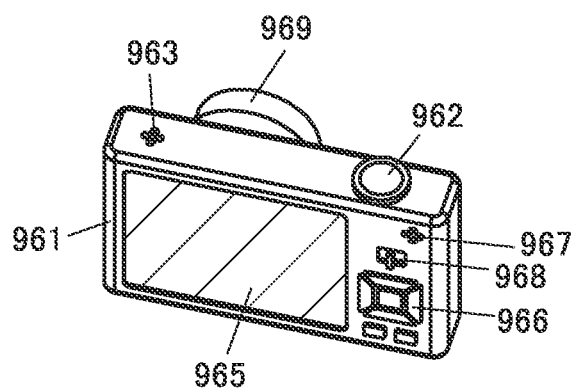
FIG. 21A to FIG. 21F are diagrams illustrating electronic devices.

FIG. 21A is a digital camera, which includes a housing 961, a shutter button 962, a microphone 963, a speaker 967, a display portion 965, operation keys 966, a zoom lever 968, a lens 969, and the like. The display apparatus of one embodiment of the present invention can be used for the display portion 965.

Figure 21B:
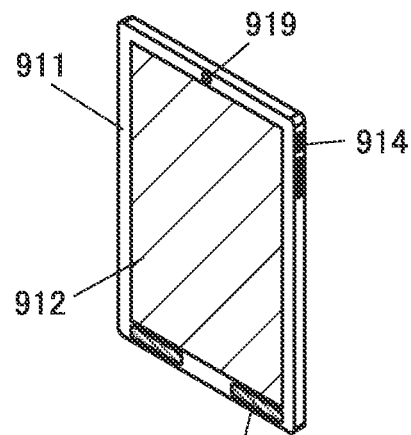

FIG. 21B is a portable data terminal, which includes a housing 911, a display portion 912, speakers 913, operation buttons 914, a camera 919, and the like. A touch panel function of the display portion 912 enables input and output of information. The display apparatus of one embodiment of the present invention can be used for the display portion 912.

Figure 21C:
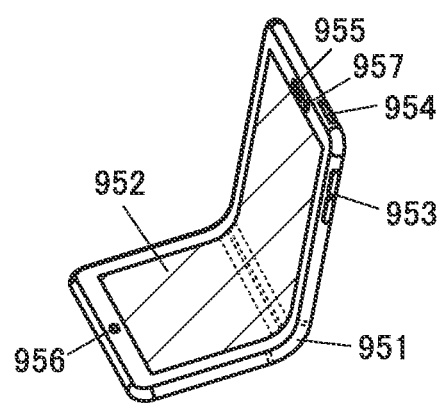

FIG. 21C is a cellular phone, which includes a housing 951, a display portion 952, an operation button 953, an external connection port 954, a speaker 955, a microphone 956, a camera 957, and the like. The display portion 952 of the cellular phone includes a touch sensor. Operations such as making a call and inputting text can be performed by touch on the display portion 952 with a finger, a stylus, or the like. The housing 901 and the display portion 952 have flexibility and can be used in a bent state as illustrated in the figure. The display apparatus of one embodiment of the present invention can be used for the display portion 952.

Figure 21D:
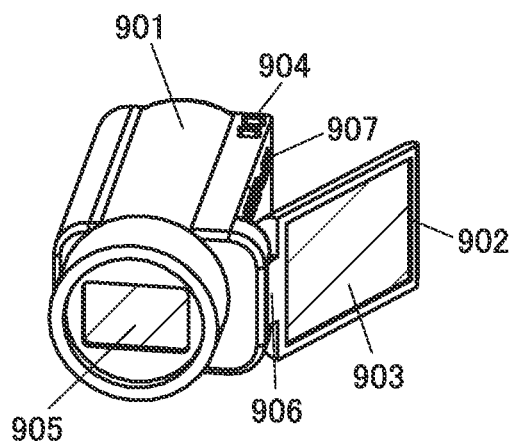

FIG. 21D is a video camera, which includes the first housing 901, a second housing 902, a display portion 903, an operation key 904, a lens 905, a connection portion 906, a speaker 907, and the like. The operation key 904 and the lens 905 are provided on the first housing 901, and the display portion 903 is provided on the second housing 902. The display apparatus of one embodiment of the present invention can be used for the display portion 903.

Figure 21E:
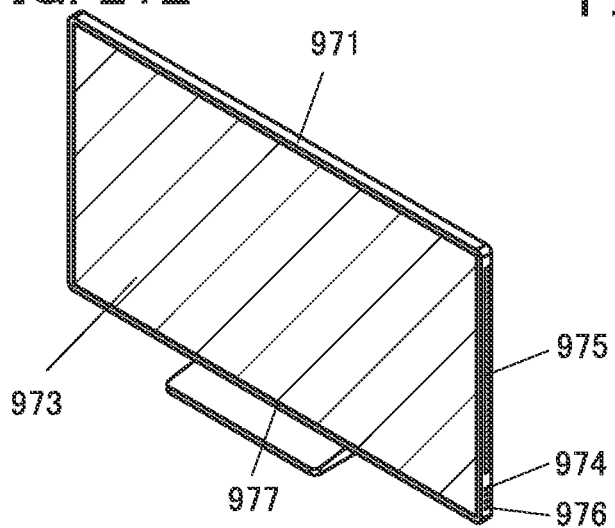

FIG. 21E is a television, which includes a housing 971, a display portion 973, an operation button 974, speakers 975, a communication connection terminal 976, an optical sensor 977, and the like. The display portion 973 includes a touch sensor that enables an input operation. The display apparatus of one embodiment of the present invention can be used for the display portion 973.

Figure 21F:
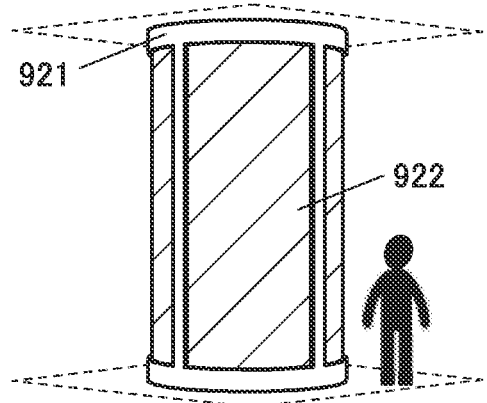

FIG. 21F is digital signage that has a large display portion 922. The large display portion 922 in the digital signage is attached to a side surface of a pillar 921, for example. The display apparatus of one embodiment of the present invention can be used for the display portion 922.

This embodiment can be implemented in combination with any of the structures described in the other embodiments and the like, as appropriate.

REFERENCE NUMERALS

11: pixel, 12: pixel, 13: circuit, 14: source driver, 15a: gate driver, 15b: gate driver, 16: pixel array, 101: transistor, 102: transistor, 103: transistor, 104: transistor, 105: capacitor, 110: circuit, 111: transistor, 112: transistor, 113: capacitor, 114: light-emitting device, 115: transistor, 116: capacitor, 117: liquid crystal device, 118: transistor, 119: transistor, 120: circuit, 121: wiring, 122: wiring, 123: wiring, 124:

wiring, 125: wiring, 126: wiring, 127: wiring, 128: wiring, 129: wiring, 130: wiring, 131: wiring, 132: wiring, 133: wiring, 134: wiring, 135: wiring, 215: display portion, 221*a*: scan line driver circuit, 231*a*: signal line driver circuit, 232*a*: signal line driver circuit, 241*a*: common line driver circuit, 723: electrode, 726: insulating layer, 728: insulating layer, 729: insulating layer, 741: insulating layer, 742: semiconductor layer, 744*a*: electrode, 744*b*: electrode, 746: electrode, 771: substrate, 772: insulating layer, 810: transistor, 811: transistor, 820: transistor, 821: transistor, 825: transistor, 826: transistor, 842: transistor, 843: transistor, 844: transistor, 845: transistor, 846: transistor, 847: transistor, 901: first housing, 902: second housing, 903: display portion, 904: operation key, 905: lens, 906: connection portion, 907: speaker, 911: housing, 912: display portion, 913: speaker, 914: operation button, 919: camera, 921: pillar, 922: display portion, 951: housing, 952: display portion, 953: operation button, 954: external connection port, 955: speaker, 956: microphone, 957: camera, 961: housing, 962: shutter button, 963: microphone, 965: display portion, 966: operation key, 967: speaker, 968: zoom lever, 969: lens, 971: housing, 973: display portion, 974: operation button, 975: speaker, 976: communication connection terminal, 977: optical sensor, 4001: substrate, 4003: layer, 4004: layer, 4005: sealant, 4006: substrate, 4008: liquid crystal layer, 4009: composite layer, 4010: transistor, 4011: transistor, 4013: liquid crystal device, 4014: wiring, 4015: electrode, 4016: light-scattering liquid crystal device, 4017: electrode, 4018: FPC, 4019: anisotropic conductive layer, 4020: capacitor, 4021: electrode, 4022: transistor, 4023: transistor, 4030: electrode layer, 4031: electrode layer, 4032: insulating layer, 4033: insulating layer, 4035: spacer, 4041: printed circuit board, 4042: integrated circuit, 4102: insulating layer, 4103: insulating layer, 4104: insulating layer, 4110: insulating layer, 4111: insulating layer, 4112: insulating layer, 4131: coloring layer, 4132: light-blocking layer, 4133: insulating layer, 4200: input device, 4210: touch panel, 4227: electrode, 4228: electrode, 4237: wiring, 4238: wiring, 4239: wiring, 4263: substrate, 4272*b*: FPC, 4273*b*: IC, 4340*a*: backlight unit, 4340*b*: backlight unit, 4341: light guide plate, 4342: light-emitting device, 4344: lens, 4345: mirror, 4347: printed circuit board, 4348: reflective layer, 4352: diffusing plate, 4510: partition wall, 4511: light-emitting layer, 4513: light-emitting device, 4514: filler

The invention claimed is:

1. A display apparatus comprising a first pixel circuit and a second pixel circuit,
    wherein the first pixel circuit comprises a first transistor, a second transistor, a third transistor, a capacitor, and a first display device,
    wherein the second pixel circuit comprises the first transistor, the second transistor, a fourth transistor, the capacitor, and a second display device,
    wherein a circuit composed of the first transistor, the second transistor, and the capacitor is configured to add first data and second data to generate third data, and
    wherein the first display device and the second display device are configured to receive the third data.

2. A display apparatus comprising a first pixel circuit and a second pixel circuit,
    wherein the first pixel circuit comprises a first transistor, a second transistor, a third transistor, a first capacitor, and a first circuit,
    wherein the second pixel circuit comprises the first transistor, the second transistor, a fourth transistor, the first capacitor, and a second circuit,
    wherein the first circuit and the second circuit each comprise a display device,
    wherein one of a source and a drain of the first transistor is electrically connected to one electrode of the first capacitor,
    wherein the one electrode of the first capacitor is electrically connected to one of a source and a drain of the third transistor,
    wherein the other of the source and the drain of the third transistor is electrically connected to the first circuit,
    wherein the other electrode of the first capacitor is electrically connected to one of a source and a drain of the second transistor,
    wherein the one of the source and the drain of the second transistor is electrically connected to one of a source and a drain of the fourth transistor, and
    wherein the other of the source and the drain of the fourth transistor is electrically connected to the second circuit.

3. The display apparatus according to claim 2,
    wherein the first circuit and the second circuit comprise a fifth transistor, a second capacitor, and a light-emitting device as the display device,
    wherein a gate of the fifth transistor is electrically connected to the third transistor or the fourth transistor,
    wherein one of a source and a drain of the fifth transistor is electrically connected to one electrode of the light-emitting device,
    wherein the one electrode of the light-emitting device is electrically connected to one electrode of the second capacitor, and
    wherein the other electrode of the second capacitor is electrically connected to the gate of the fifth transistor.

4. The display apparatus according to claim 2,
    wherein the first circuit and the second circuit comprise a liquid crystal device as the display device, and
    wherein one electrode of the liquid crystal device is electrically connected to the other of the source and the drain of the third transistor or the fourth transistor.

5. The display apparatus according to claim 4, further comprising a third capacitor,
    wherein one electrode of the third capacitor is electrically connected to the one electrode of the liquid crystal device.

6. The display apparatus according to claim 2,
    wherein the first capacitor comprises a fifth capacitor and a sixth capacitor, and
    wherein the fifth capacitor and the sixth capacitor are connected in parallel.

7. The display apparatus according to claim 1,
    wherein the transistors in the first pixel circuit and the second pixel circuit each comprise a metal oxide in a channel formation region, and the metal oxide comprises In, Zn, and M (M is Al, Ti, Ga, Ge, Sn, Y, Zr, La, Ce, Nd, or Hf).

8. An electronic device comprising the display apparatus according to claim 1 and a camera.

9. The display apparatus according to claim 3,
    wherein the first capacitor comprises a fifth capacitor and a sixth capacitor, and
    wherein the fifth capacitor and the sixth capacitor are connected in parallel.

10. The display apparatus according to claim 4,
    wherein the first capacitor comprises a fifth capacitor and a sixth capacitor, and
    wherein the fifth capacitor and the sixth capacitor are connected in parallel.

11. The display apparatus according to claim 5,
wherein the first capacitor comprises a fifth capacitor and a sixth capacitor, and
wherein the fifth capacitor and the sixth capacitor are connected in parallel.

12. The display apparatus according to claim 2,
wherein the transistors in the first pixel circuit and the second pixel circuit each comprise a metal oxide in a channel formation region, and the metal oxide comprises In, Zn, and M (M is Al, Ti, Ga, Ge, Sn, Y, Zr, La, Ce, Nd, or Hf).

13. The display apparatus according to claim 3,
wherein the transistors in the first pixel circuit and the second pixel circuit each comprise a metal oxide in a channel formation region, and the metal oxide comprises In, Zn, and M (M is Al, Ti, Ga, Ge, Sn, Y, Zr, La, Ce, Nd, or Hf).

14. The display apparatus according to claim 4,
wherein the transistors in the first pixel circuit and the second pixel circuit each comprise a metal oxide in a channel formation region, and the metal oxide comprises In, Zn, and M (M is Al, Ti, Ga, Ge, Sn, Y, Zr, La, Ce, Nd, or Hf).

15. The display apparatus according to claim 5,
wherein the transistors in the first pixel circuit and the second pixel circuit each comprise a metal oxide in a channel formation region, and the metal oxide comprises In, Zn, and M (M is Al, Ti, Ga, Ge, Sn, Y, Zr, La, Ce, Nd, or Hf).

* * * * *